(12) United States Patent
Wang et al.

(10) Patent No.: US 11,171,236 B2
(45) Date of Patent: Nov. 9, 2021

(54) CUT-FIN ISOLATION REGIONS AND METHOD FORMING SAME

(71) Applicant: Taiwan Semiconductor Manufacturing Company, Ltd., Hsinchu (TW)

(72) Inventors: Shiang-Bau Wang, Pingzchen (TW); Li-Wei Yin, Hsinchu (TW); Shao-Hua Hsu, Taitung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 328 days.

(21) Appl. No.: 16/153,026

(22) Filed: Oct. 5, 2018

(65) Prior Publication Data
US 2020/0044070 A1 Feb. 6, 2020

Related U.S. Application Data

(60) Provisional application No. 62/712,330, filed on Jul. 31, 2018.

(51) Int. Cl.
| | |
|---|---|
| H01L 21/8234 | (2006.01) |
| H01L 29/78 | (2006.01) |
| H01L 21/762 | (2006.01) |
| H01L 29/66 | (2006.01) |
| H01L 21/84 | (2006.01) |
| H01L 27/088 | (2006.01) |

(52) U.S. Cl.
CPC ...... H01L 29/785 (2013.01); H01L 21/76243 (2013.01); H01L 21/76267 (2013.01); H01L 21/823431 (2013.01); H01L 21/845 (2013.01); H01L 27/0886 (2013.01); H01L 29/66795 (2013.01)

(58) Field of Classification Search
CPC ............. H01L 29/785; H01L 29/66795; H01L 29/66348; H01L 29/66621; H01L 29/0642; H01L 29/7855; H01L 29/7846
See application file for complete search history.

(56) References Cited

U.S. PATENT DOCUMENTS

| | | | |
|---|---|---|---|
| 9,455,198 B1 | 9/2016 | Yu et al. | |
| 9,653,583 B1 * | 5/2017 | Zhao | ................ H01L 29/66795 |
| 9,721,848 B1 | 8/2017 | Bu et al. | |
| 9,761,495 B1 * | 9/2017 | Xie | ...................... H01L 21/308 |

(Continued)

*Primary Examiner* — Khaja Ahmad
*Assistant Examiner* — Pavel G Ivanov
(74) *Attorney, Agent, or Firm* — Slater Matsil, LLP

(57) ABSTRACT

A method includes forming a first semiconductor fin and a second semiconductor fin parallel to each other and protruding higher than top surfaces of isolation regions. The isolation regions include a portion between the first and the second semiconductor fins. The method further includes forming a gate stack crossing over the first and the second semiconductor fins, etching a portion of the gate stack to form an opening, wherein the portion of the isolation regions, the first semiconductor fin, and the second semiconductor fin are exposed to the opening, etching the first semiconductor fin, the second semiconductor fin, and the portion of the isolation regions to extend the opening into a bulk portion of a semiconductor substrate below the isolation regions, and filling the opening with a dielectric material to form a cut-fin isolation region.

20 Claims, 38 Drawing Sheets

(56) References Cited

U.S. PATENT DOCUMENTS

| | | |
|---|---|---|
| 2009/0278183 A1 | 11/2009 | Lee |
| 2015/0311121 A1 | 10/2015 | Petrarca et al. |
| 2015/0357331 A1 | 12/2015 | Cheng et al. |
| 2016/0218041 A1 | 7/2016 | Du et al. |
| 2017/0005014 A1 | 1/2017 | Yamashita et al. |
| 2017/0018437 A1 | 1/2017 | Greene et al. |
| 2017/0125411 A1 | 5/2017 | Yu et al. |
| 2017/0125579 A1 | 5/2017 | Lin |
| 2017/0243790 A1* | 8/2017 | Xie .................. H01L 21/31051 |
| 2018/0006135 A1 | 1/2018 | Shen |

* cited by examiner

CUT-FIN ISOLATION REGIONS AND METHOD FORMING SAME

PRIORITY CLAIM AND CROSS-REFERENCE

This application claims the benefit of the following provisionally filed U.S. patent application: Application Ser. No. 62/712,330, filed Jul. 31, 2018, and entitled "Cut-Fin Isolation Regions and Method Forming Same," which application is hereby incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs, and for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
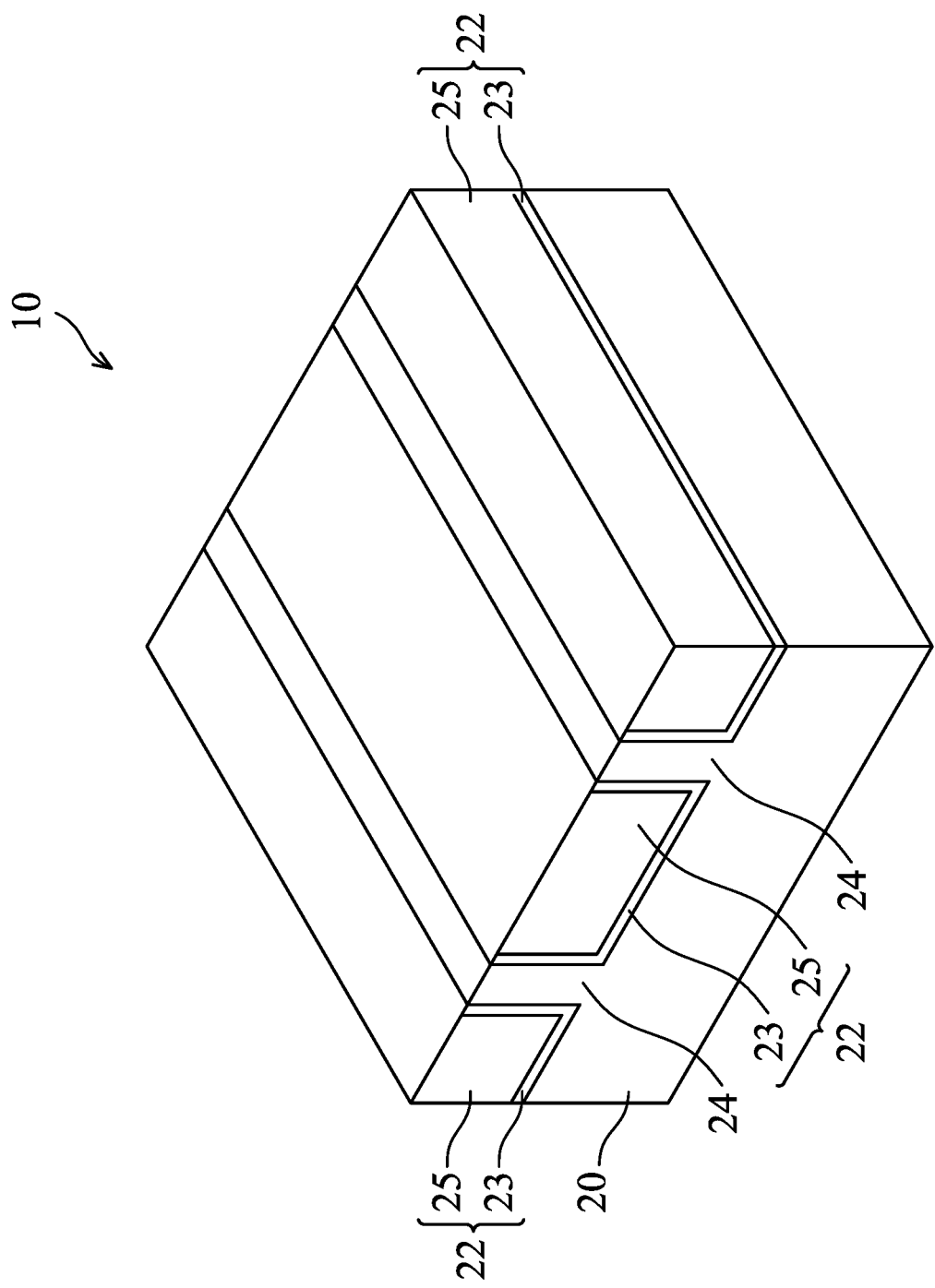
FIGS. 1 through 4, 5A, 5B, 6A, 6B, 7A, 7B, 8A, 8B, 9, 10, 11A through 11C, 12A through 12C, 13A through 13C, 14A through 14C, 15A through 15C, 16A through 16C, 17A through 17C, and 18 illustrate the perspective views, top views, and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistor (FinFET) formed using fin-cut processes and the methods of forming the same are provided in accordance with various embodiments. The intermediate stages of forming the transistors are illustrated in accordance with some embodiments. Some variations of some embodiments are discussed. Throughout the various views and illustrative embodiments, like reference numbers are used to designate like elements.

Figure 20:
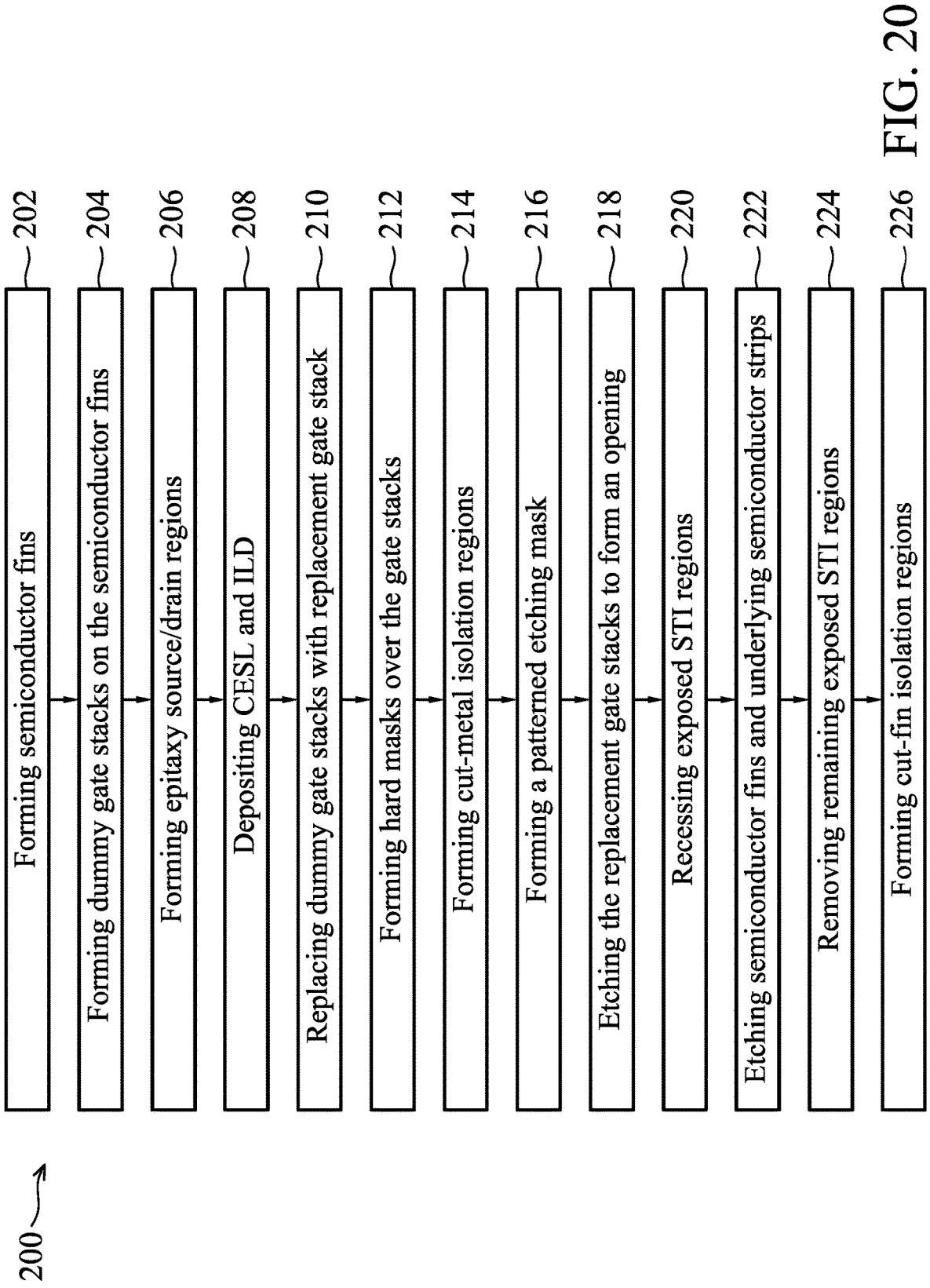
FIG. 20 illustrates the process flow for forming an n-type FinFET in accordance with some embodiments.

FIGS. 1 through 4, 5A, 5B, 6A, 6B, 7A, 7B, 8A, 8B, 9, 10, 11A through 11C, 12A through 12C, 13A through 13C, 14A through 14C, 15A through 15C, 16A through 16C, 17A through 17C, and 18 illustrate the cross-sectional views, top views, and perspective views of intermediate stages in the formation of FinFETs adopting fin-cut processes in accordance with some embodiments of the present disclosure. The processes are also reflected schematically in the process flow as shown in FIG. 20.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions are formed to extend from a top surface of substrate 20 into substrate 20. In accordance with some embodiments of the present disclosure, STI regions 22 include liners 23 and dielectric regions 25. Liners 23 may be formed of silicon nitride, silicon oxide, or the like. Dielectric regions 25 may be formed of an oxide-based dielectric material (such as silicon oxide), which may be formed using Flowable Chemical Vapor Deposition (FCVD), spin-on coating, or the like.

The portions of substrate 20 between neighboring STI regions 22 are referred to as semiconductor strips 24. The top surfaces of semiconductor strips 24 and the top surfaces of STI regions 22 may be substantially level with each other. In accordance with some embodiments of the present disclosure, semiconductor strips 24 are parts of the original substrate 20, and the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to regrow another semiconductor material in the recesses. Accordingly, semiconductor strips 24 are formed of a semiconductor material different from that of substrate 20. In accordance with some embodiments of the present disclosure, semiconductor strips 24 are formed of silicon germanium, silicon carbon, a III-V compound semiconductor material, or the like.

Figure 2:
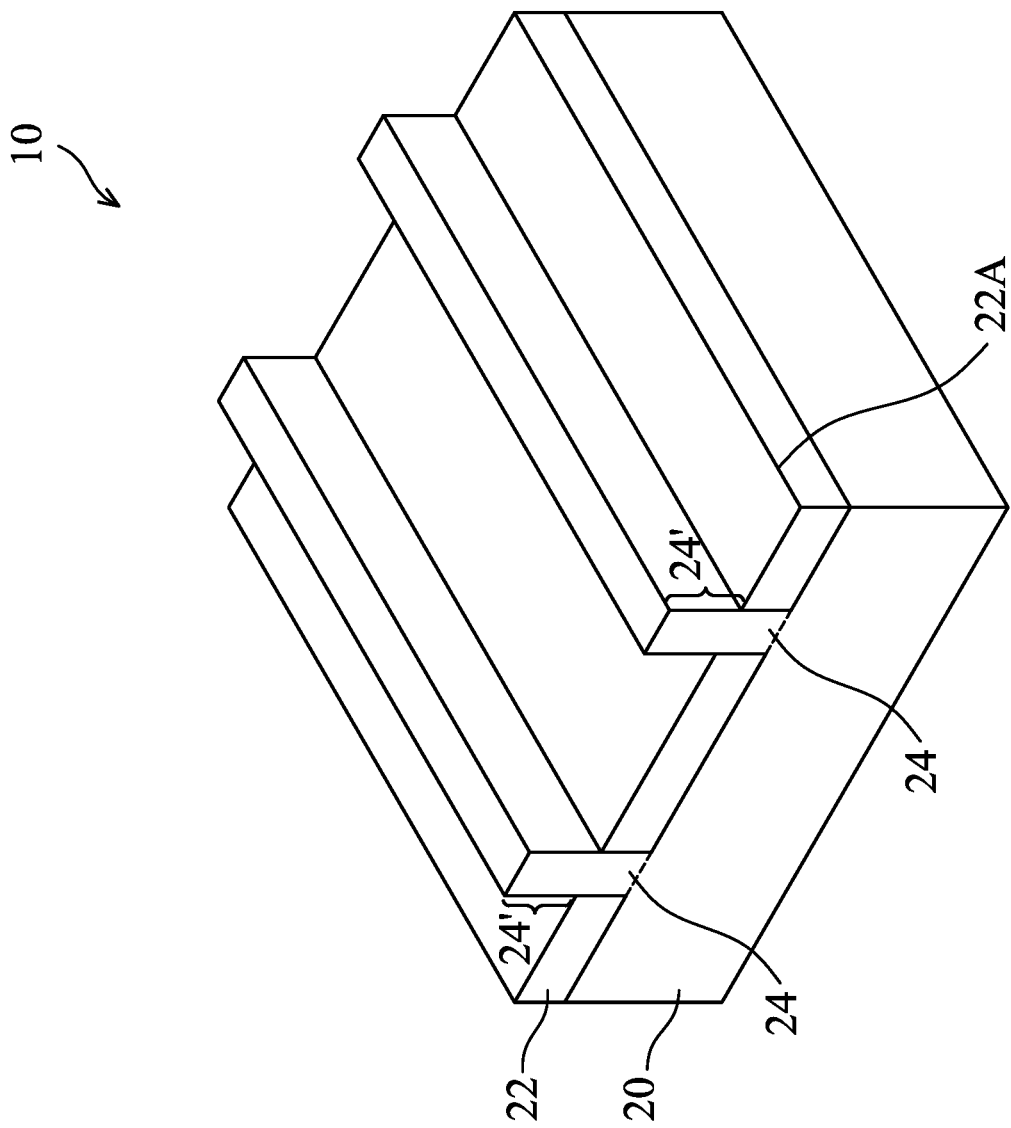

Referring to FIG. 2, STI regions 22 are recessed, so that the top portions of semiconductor strips 24 protrude higher than the top surfaces 22A of the remaining portions of STI regions 22 to form protruding fins 24'. The respective process is illustrated as process 202 in the process flow as shown in FIG. 20. The etching may be performed using a dry etching process, wherein $HF_3$ and $NH_3$ are used as the etching gases. In accordance with alternative embodiments of the present disclosure, the recessing of STI regions 22 is performed using a wet etch process. The etching chemical may include HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 24' may be the same as or different from that of substrate 20. For example, protruding fins 24' may be formed of Si, SiP, SiC, SiPC, SiGe, SiGeB, Ge, or a III-V compound semiconductor such as InP, GaAs, AlAs, InAs, InAlAs, InGaAs, or the like.

Figure 3:
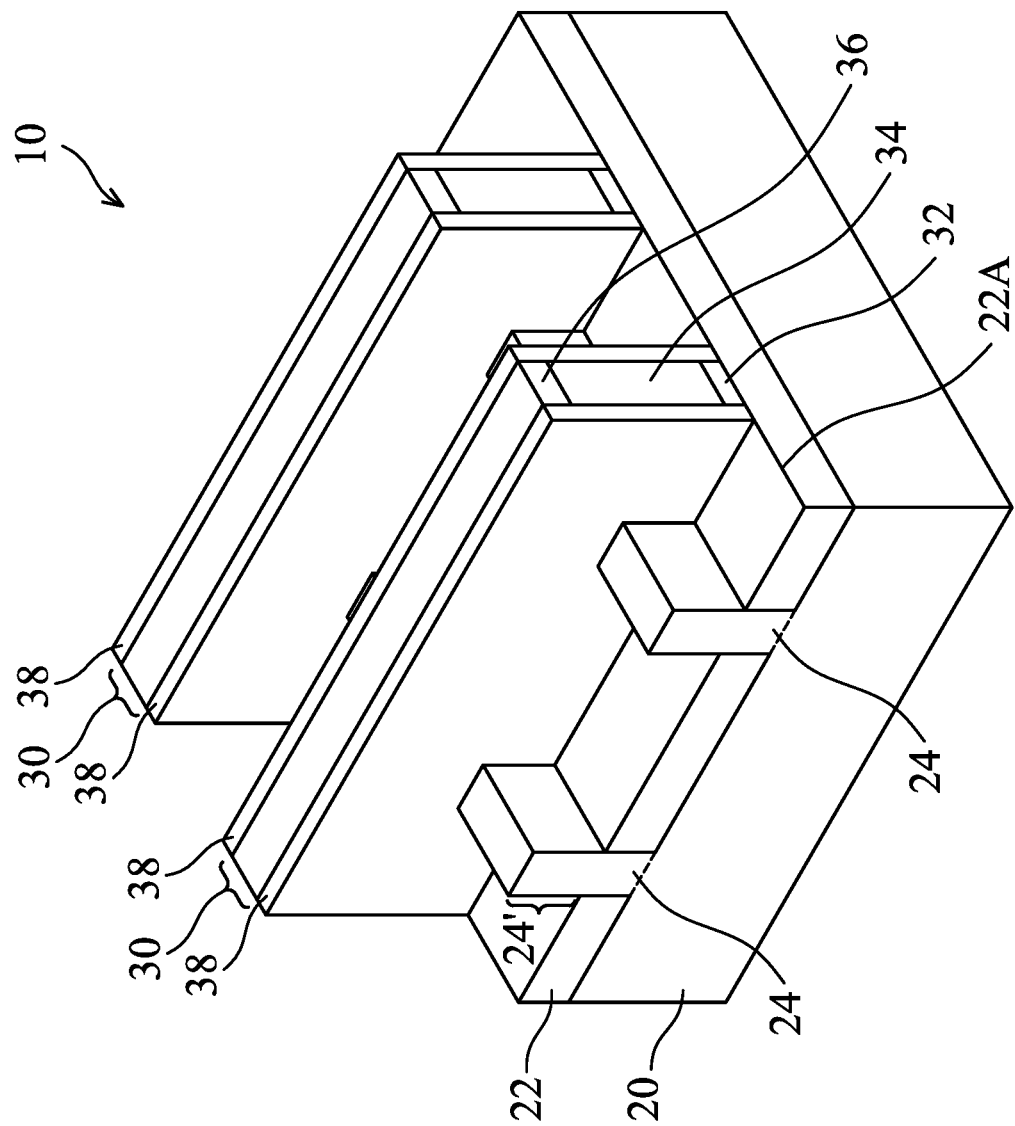

Referring to FIG. 3, dummy gate stacks 30 are formed on the top surfaces and the sidewalls of (protruding) fins 24'. The respective process is illustrated as process 204 in the process flow as shown in FIG. 20. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof, or the like. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of a dielectric material such as silicon nitride, silicon oxide, silicon carbo-nitride, silicon oxynitride, silicon oxy carbonitride, or the like, and may have a single-layer structure or a multi-layer structure including a plurality of dielectric layers.

Figure 4:
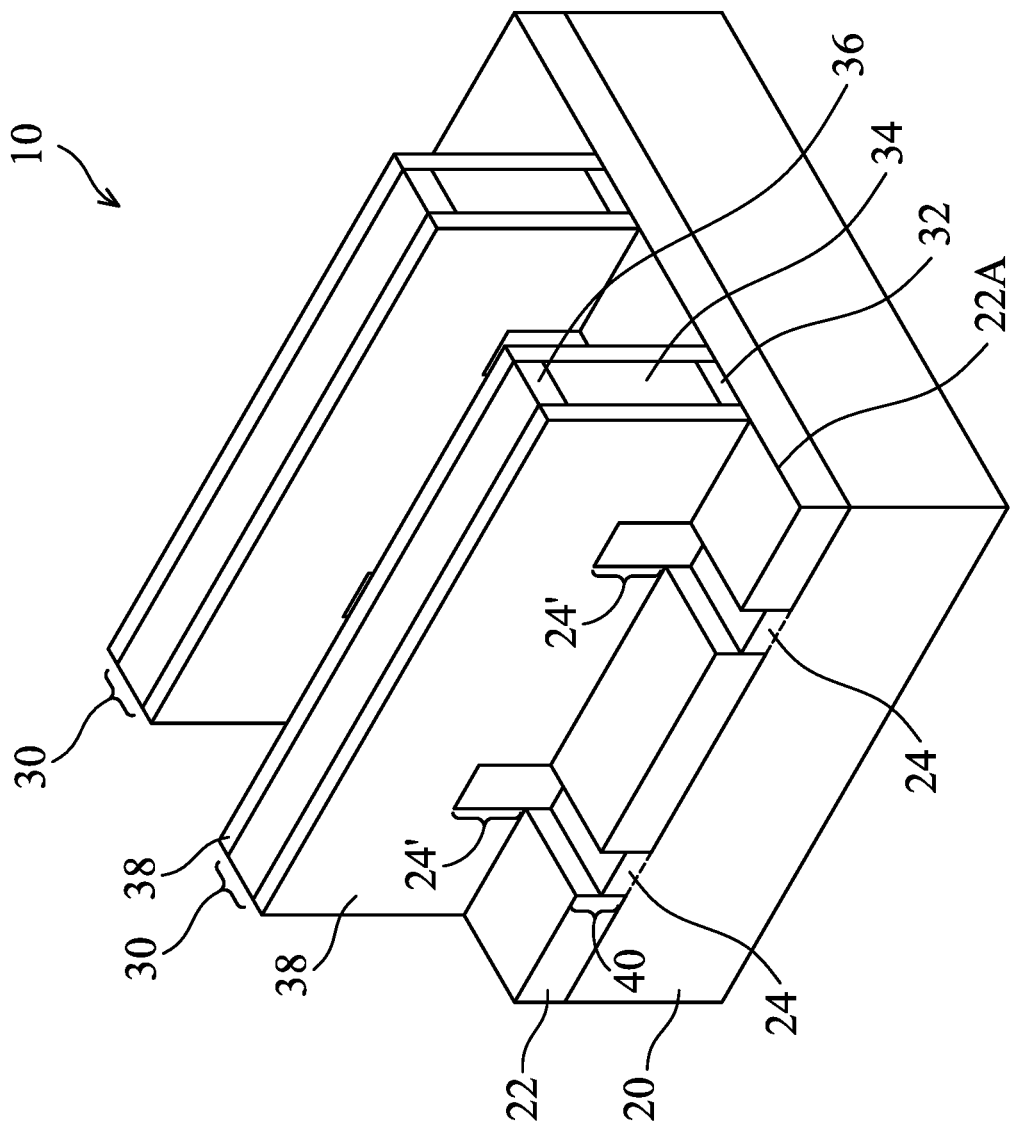

In accordance with some embodiments of the present disclosure, an etching step (referred to as fin recessing hereinafter) is performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stacks 30 and gate spacers 38 are protected from the etching process. The top surfaces of the recessed semiconductor strips 24 may be lower than the top surfaces 22A of STI regions 22 in accordance with some embodiments. Recesses 40 are accordingly formed between STI regions 22. Recesses 40 are located on the opposite sides of dummy gate stacks 30.

Figure 5A:
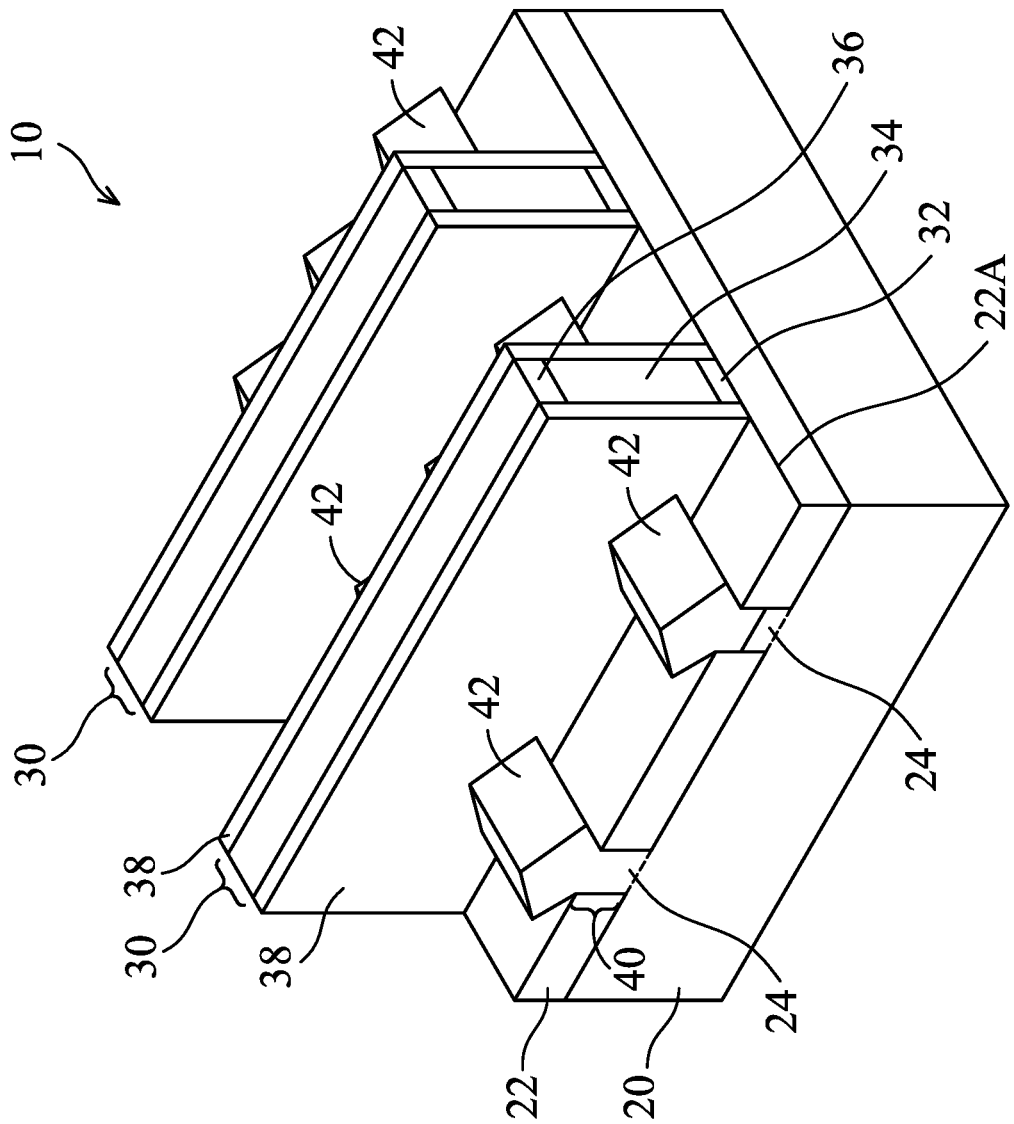

Next, epitaxy regions (source/drain regions) 42 are formed by selectively growing a semiconductor material from recesses 40, resulting in the structure in FIG. 5A. The respective process is illustrated as process 206 in the process flow as shown in FIG. 20. In accordance with some embodiments of the present disclosure, epitaxy regions 42 include silicon germanium, silicon, silicon carbon, or the like. Depending on whether the resulting FinFET is a p-type FinFET or an n-type FinFET, a p-type or an n-type impurity, respectively may be in-situ doped with the proceeding of the epitaxy. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed. Neighboring epitaxy regions 42 may merge with each other, or may be separated from each other.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy. Epitaxy source/drain regions 42 may include lower portions that are formed in STI regions 22, and upper portions that are formed over the top surfaces of STI regions 22.

Figure 5B:
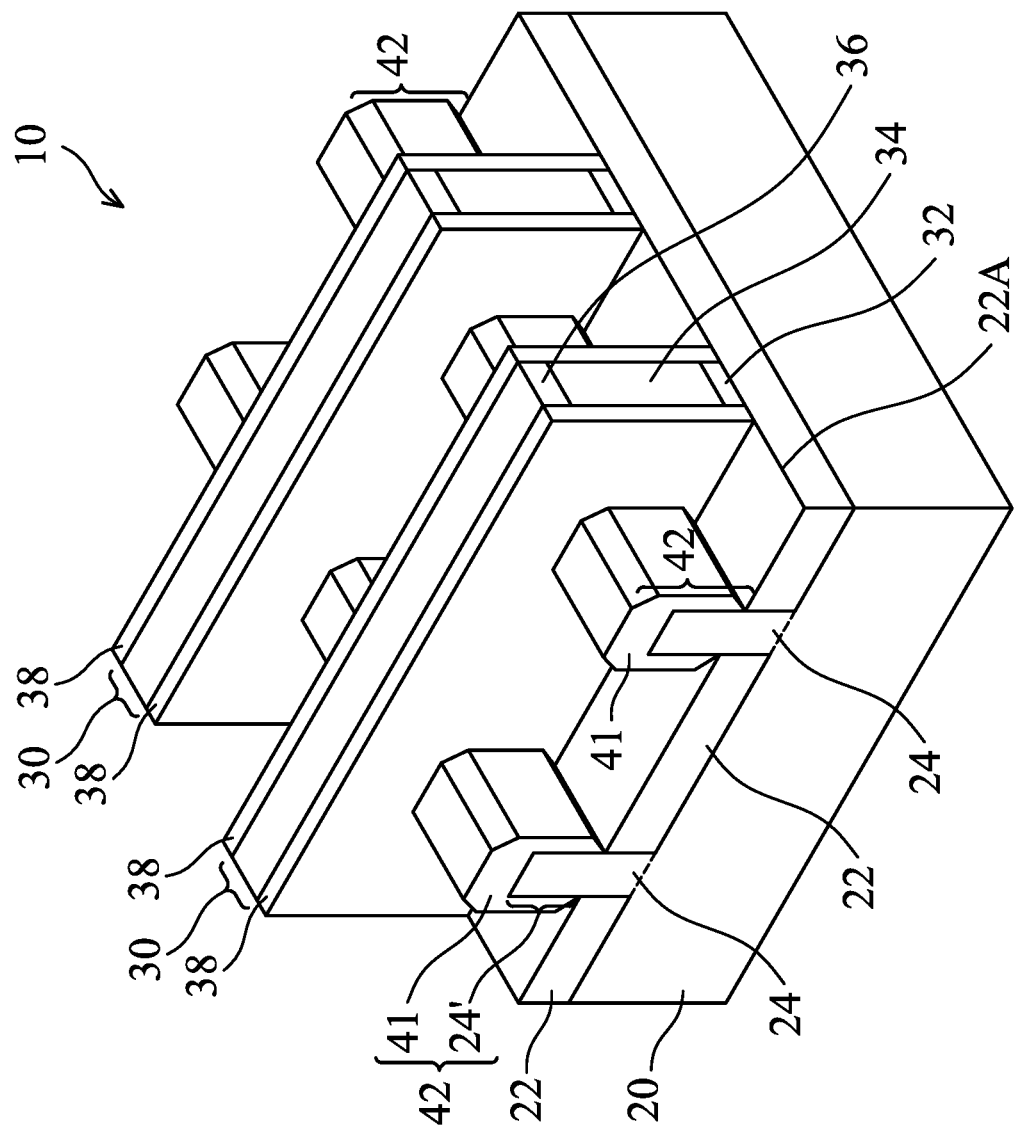

FIG. 5B illustrates the formation of cladding source/drain regions 42 in accordance with alternative embodiments of the present disclosure. In accordance with these embodiments, the protruding fins 24' as shown in FIG. 3 are not recessed, and epitaxy regions 41 are grown on protruding fins 24'. The material of epitaxy regions 41 may be similar to the material of the epitaxy semiconductor material 42 as shown in FIG. 5A, depending on whether the resulting FinFET is a p-type or an n-type FinFET. Accordingly, source/drain regions 42 include protruding fins 24' and the epitaxy region 41. An implantation may (or may not) be performed to implant an n-type impurity or a p-type impurity. The neighboring cladding source/drain regions 42 may also merge with each other, or stay separated from each other.

Figure 6A:
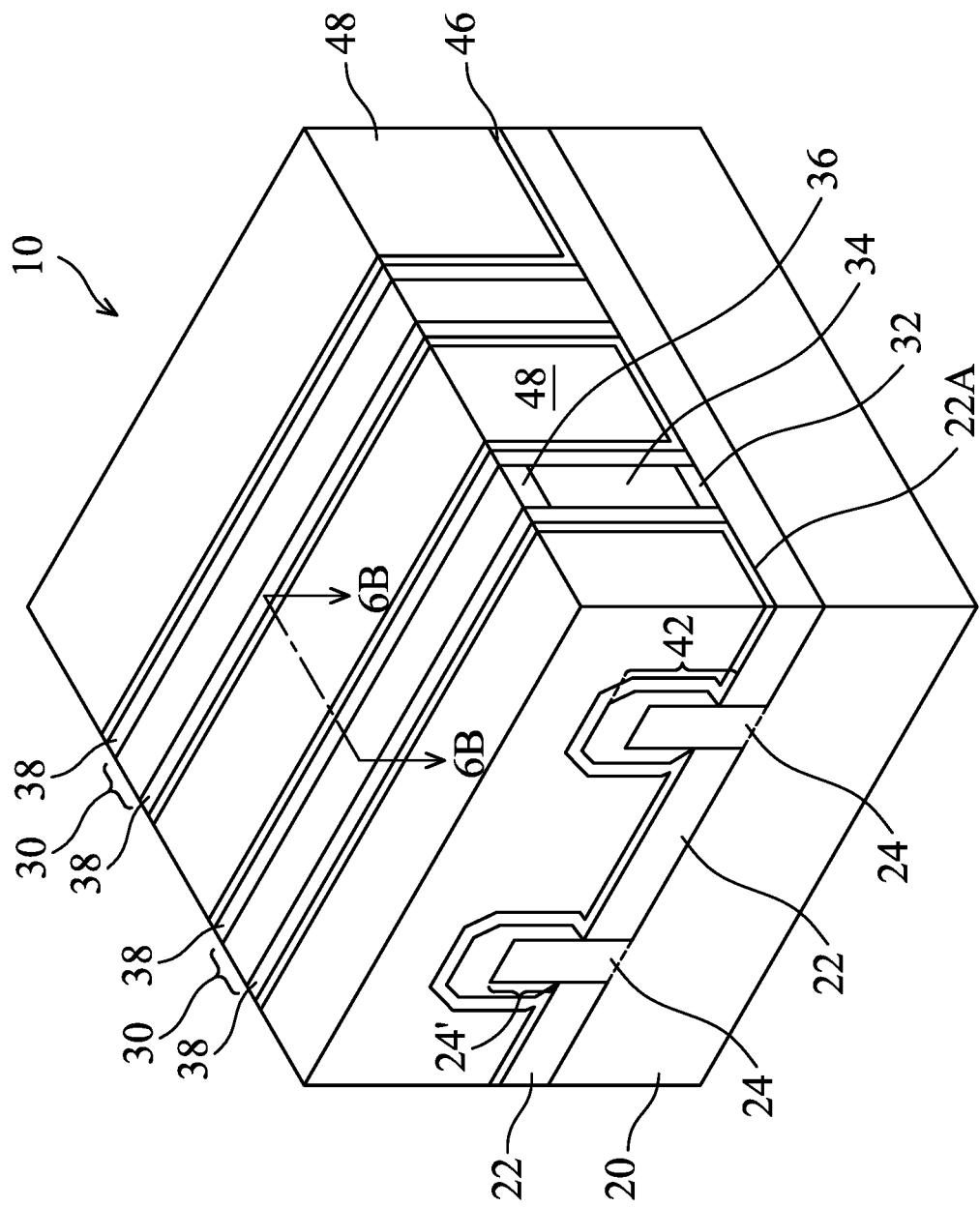

FIG. 6A illustrates a perspective view of the structure after the formation of Contact Etch Stop Layer (CESL) 46 and Inter-Layer Dielectric (ILD) 48. The respective process is illustrated as process 208 in the process flow as shown in FIG. 20. CESL 46 may be formed of silicon nitride, silicon carbo-nitride, or the like. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be a silicon-oxide based oxide such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process is performed to level the top surfaces of ILD 48, dummy gate stacks 30, and gate spacers 38 with each other.

Figure 6B:
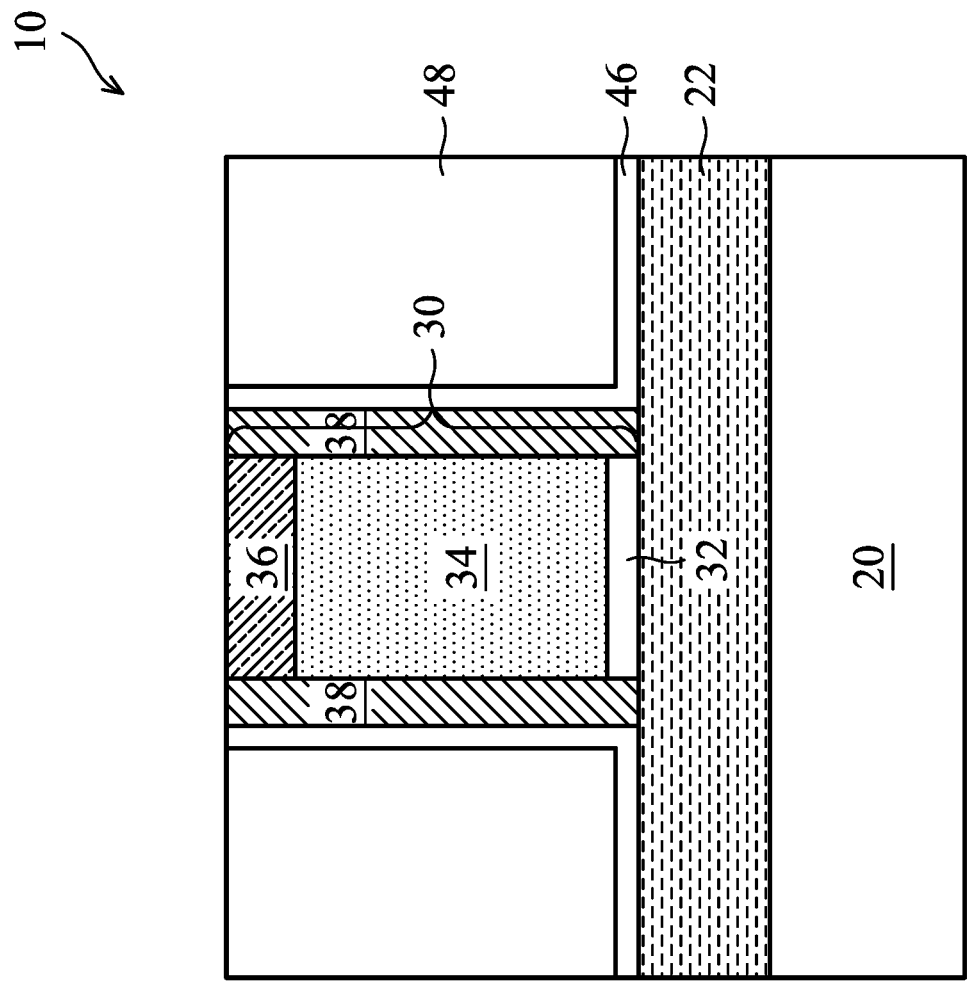

A cross-sectional view of the structure shown in FIG. 6A is illustrated in FIG. 6B. The cross-sectional view is obtained from the vertical plane containing line 6B-6B in FIG. 6A. As shown in FIG. 6B, one of dummy gate stacks 30 is illustrated. The illustrated portion of dummy gate stacks 30 is the portion directly over STI region 22. Protruding fins 24' are in other planes that are not shown.

Figure 7A:
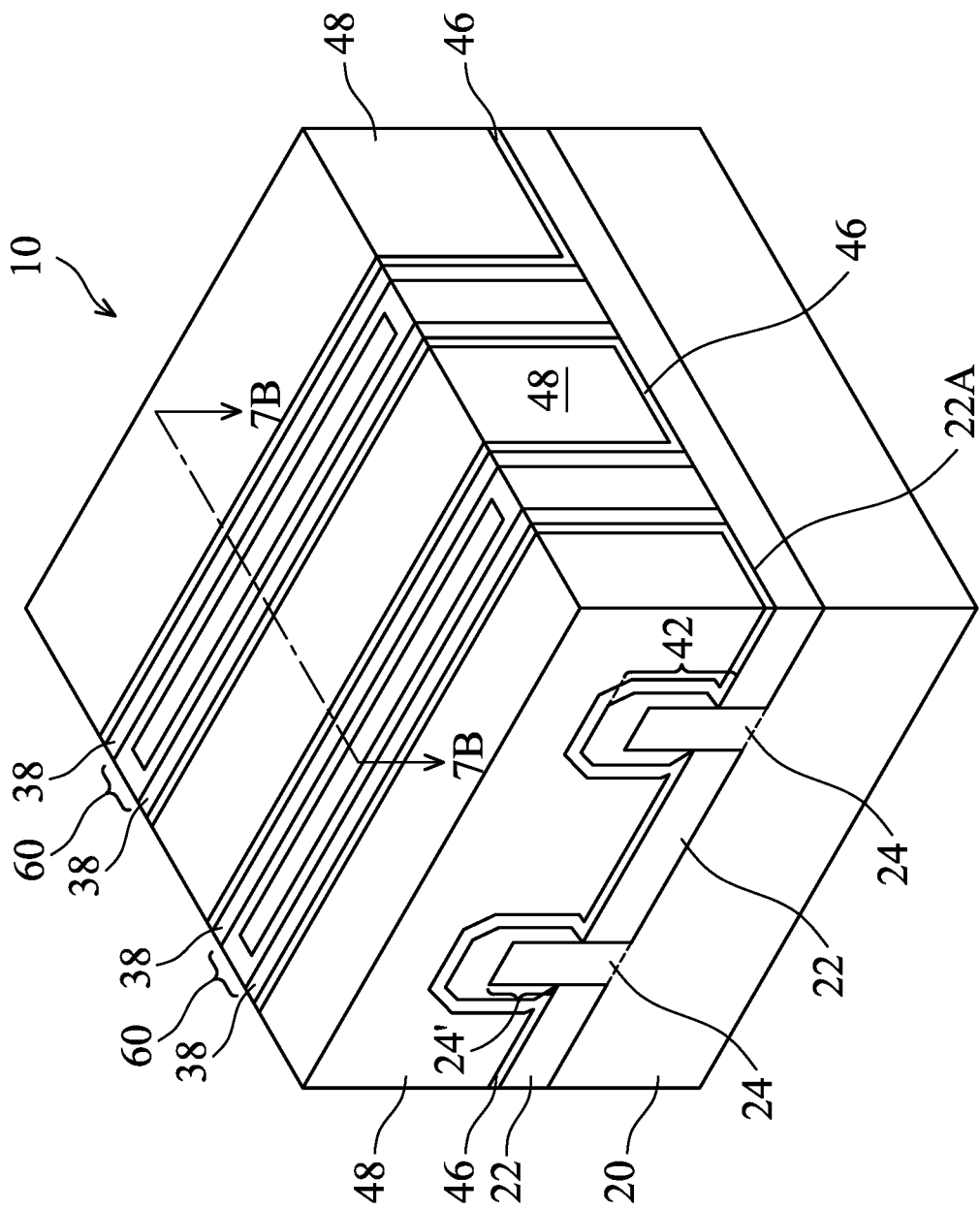
Figure 7B:
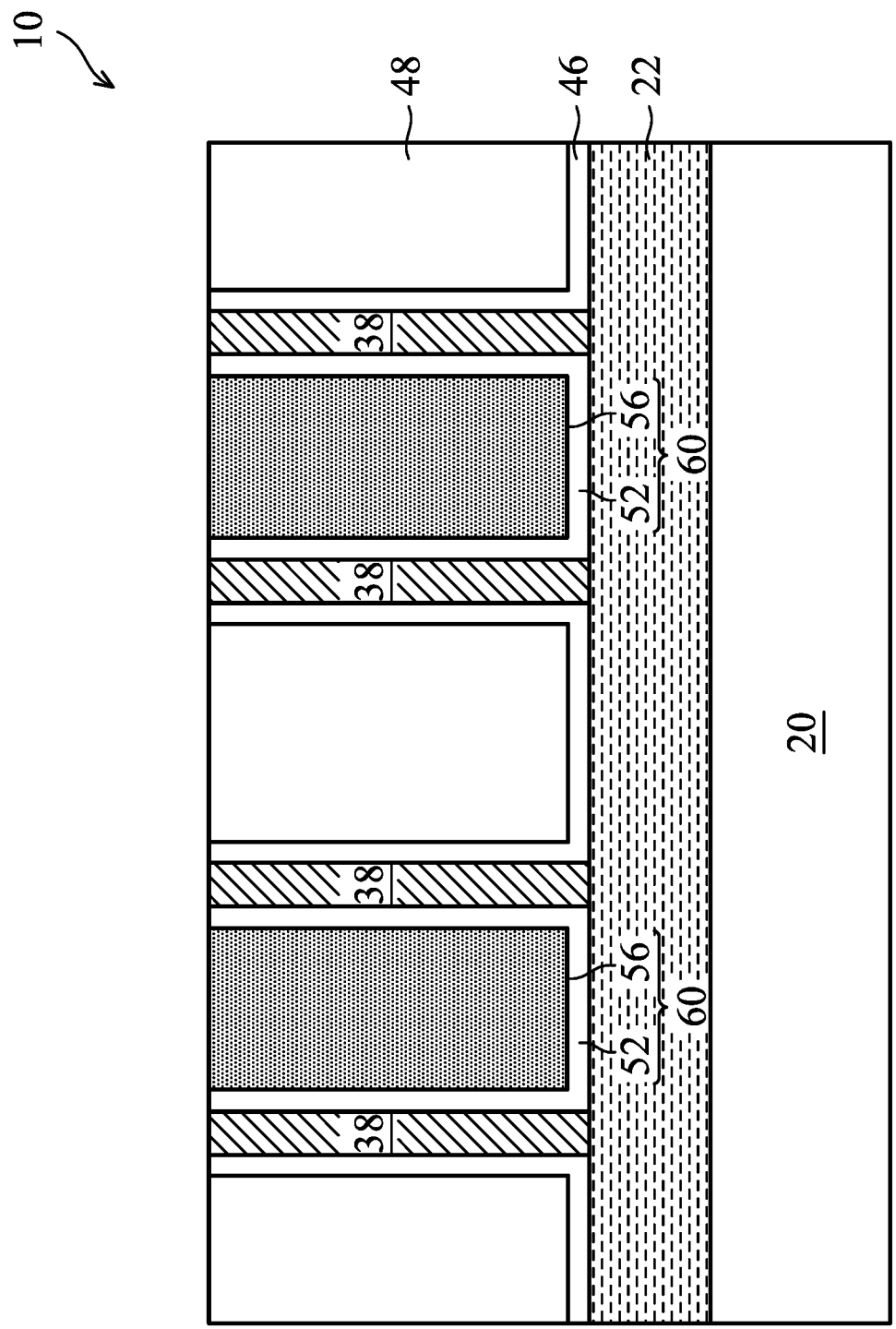

Next, dummy gate stacks 30, which include hard mask layers 36, dummy gate electrodes 34 and dummy gate dielectrics 32, are replaced with replacement gate stacks, which may include metal gates and replacement gate dielectrics as shown in FIGS. 7A and 7B. The respective process is illustrated as process 210 in the process flow as shown in FIG. 20. In accordance with some embodiments of the present disclosure, the replacement process includes etching hard mask layers 36, dummy gate electrodes 34, and dummy gate dielectrics 32 as shown in FIGS. 6A and 6B in one or a plurality of etching steps, resulting in openings to be formed between opposite portions of gate spacers 38. The respective structure may be realized from the structure shown in FIG. 6A by removing dummy gate stacks 30.

Next, referring to FIGS. 7A and 7B, (replacement) gate stacks 60 are formed, which include gate dielectric layers 52 (refer to FIG. 7B) and gate electrodes 56. The formation of gate stacks 60 includes forming/depositing a plurality of layers, and then performing a planarization process such as a CMP process or a mechanical grinding process. Gate dielectric layers 52 extend into the trenches left by the removed dummy gate stacks. In accordance with some embodiments of the present disclosure, gate dielectric layers 52 include Interfacial Layers (IL) as their lower parts. The ILs are formed on the exposed surfaces of protruding fins 24'. Each of the ILs may include an oxide layer such as a silicon oxide layer, which is formed through the thermal oxidation of protruding fins 24', a chemical oxidation process, or a deposition process. Gate dielectric layers 52 may also include high-k dielectric layers 52 formed over the respective ILs. High-k dielectric layers 52 may be formed of a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. The dielectric constant (k-value) of the high-k dielectric material is higher than 3.9, and may be higher than about 70.0. The high-k dielectric layers are formed as conformal layers, and extend on the sidewalls of protruding fins 24' and the sidewalls of gate spacers 38. In accordance with some embodiments of the present disclosure, the high-k dielectric layers are formed using ALD or CVD.

Referring again to FIGS. 7A and 7B, gate electrodes 56 are formed over dielectric layers 52, and fill the remaining portions of the trenches left by the removed dummy gate stacks. The sub-layers in gate electrodes 56 are not shown separately in FIG. 7A, while the sub-layers are distinguishable from each other due to the difference in their compositions. The deposition of at least some lower sub-layers may be performed using conformal deposition methods such as ALD or CVD, so that the thickness of the vertical portions and the thickness of the horizontal portions of gate electrodes 56 (and each of sub-layers) are substantially equal to each other Gate electrodes 56 may include a plurality of layers including, and not limited to, a Titanium Silicon Nitride (TSN) layer, a tantalum nitride (TaN) layer, a titanium nitride (TiN) layer, a titanium aluminum (TiAl) layer, an additional TiN and/or TaN layer, and a filling metal. Some of these layers define the work function of the respective FinFET. It is appreciated that this layer stack is an example, and metal stacks having different structures may be adopted. Furthermore, the metal layers of p-type FinFETs and the metal layers of n-type FinFETs may be different from each other so that the work functions of the metal layers are suitable for the respective p-type or n-type FinFETs. The filling metal may include aluminum, copper, tungsten, cobalt, or the like.

FIG. 7B illustrates the cross-sectional view of metal gate stacks 60. The cross-sectional view is obtained from the vertical plane containing 7B-7B as shown in FIG. 7A. Since the cross-sectional view is obtained from the plane crossing STI regions 22 rather than protruding fins 24', The IL may not exist in the cross-sectional view. Rather, the high-k dielectric layer in gate dielectric 52 contacts the top surface of STI region 22.

Figure 8A:
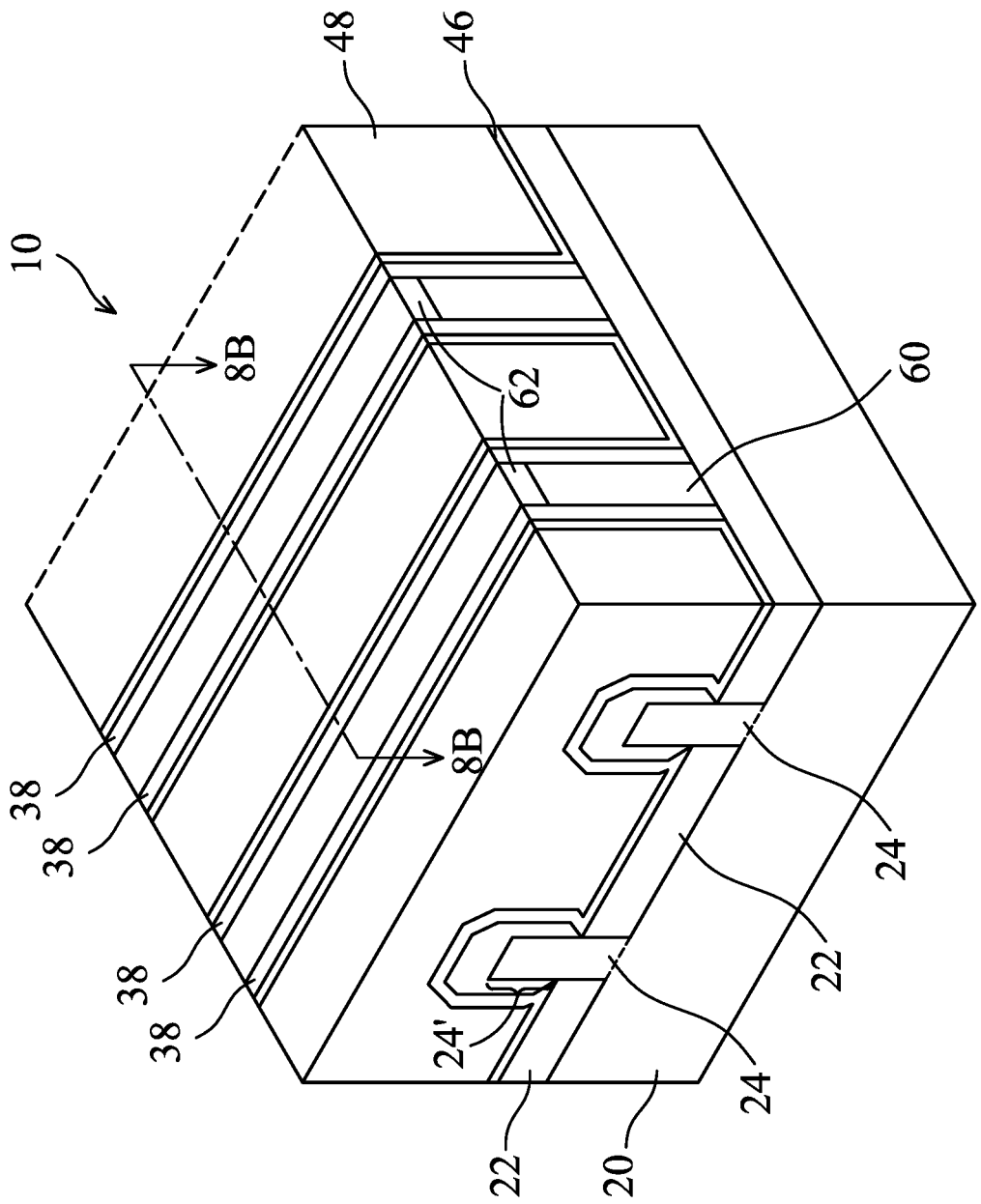
Figure 8B:
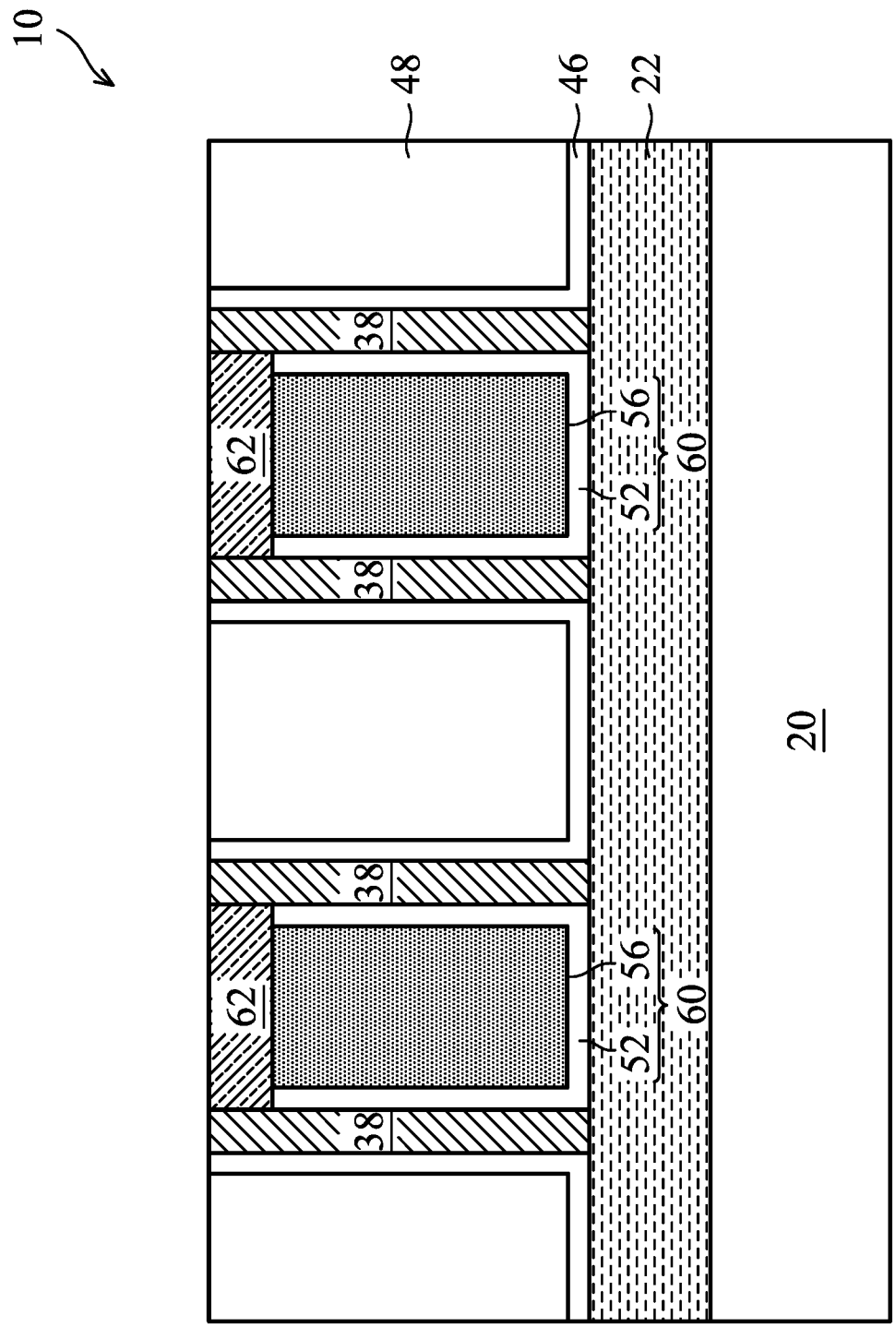

Next, as shown in FIGS. 8A and 8B, dielectric hard masks 62 are formed. The respective process is illustrated as process 212 in the process flow as shown in FIG. 20. The material of hard masks 62 may be the same as or different from some of CESL 46, ILD 48, and/or gate spacers 38. In accordance with some embodiments of the present disclosure, the formation of hard masks 62 includes recessing replacement gate stacks 60 through etching to form recesses, filling a dielectric material into the recesses, and performing a planarization to remove the excess portions of the dielectric material. The remaining portions of the dielectric material are hard masks 62. In accordance with some embodiments of the present disclosure, hard masks 62 are formed of silicon nitride, silicon oxynitride, silicon oxy-carbide, silicon oxy carbo-nitride, or the like.

FIG. 8B illustrates a cross-sectional view of the structure shown in FIG. 8A, with the cross-sectional view obtained from the plane containing line 8B-8B in FIG. 8A.

Figure 9:
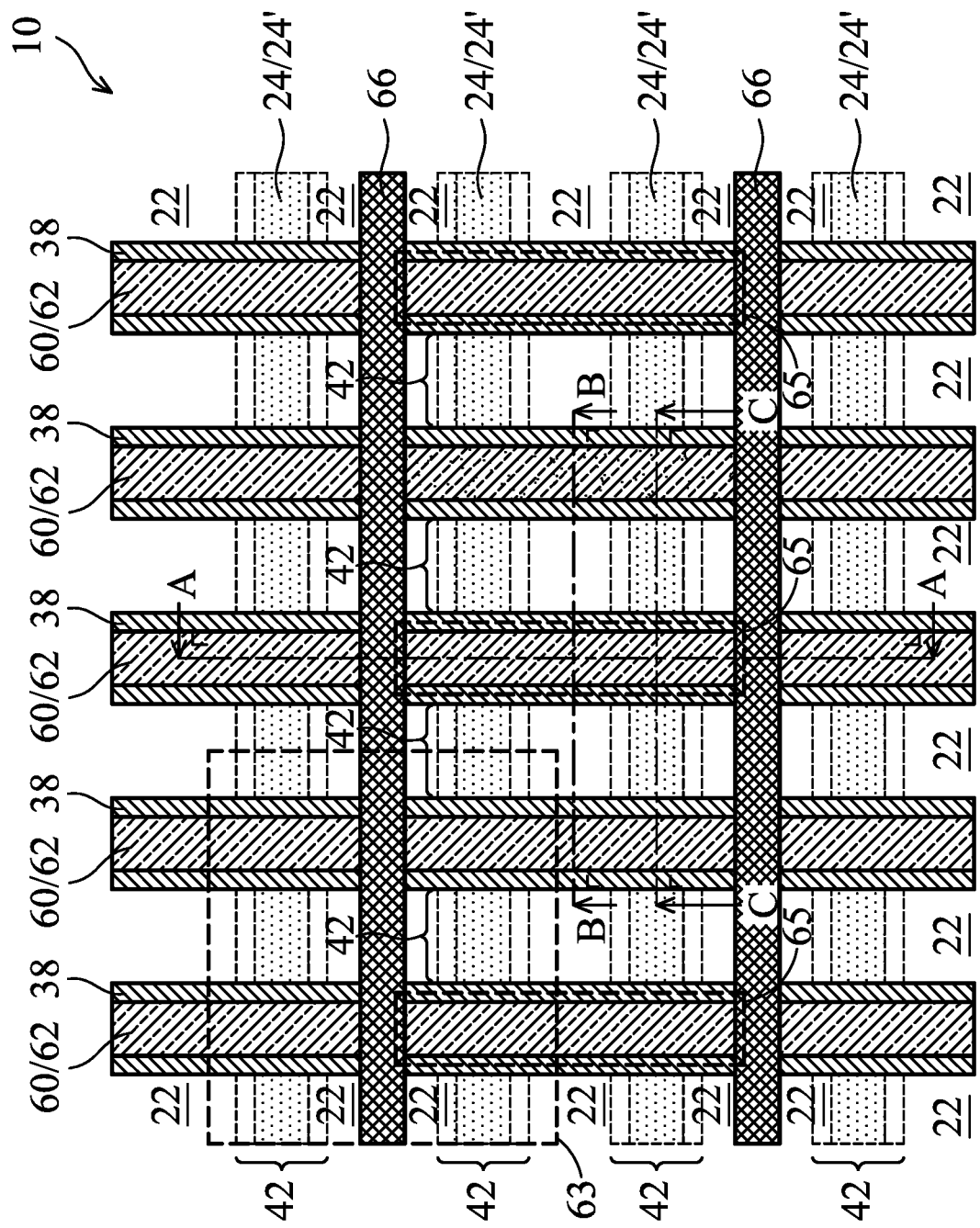

FIG. 9 illustrates a top view of a portion of a device die in wafer 10 in accordance with some embodiments of the present disclosure. A plurality of fins 24' and semiconductor strips 24 are allocated as parallel strips between STI regions 22. A plurality of gate stacks 60 and hard masks 62 are also formed as parallel strips, with source/drain regions 42 formed based on the fins 24' and between gate stacks 60. A plurality of isolation regions 66 are formed to cut the long gate stacks 60 apart. Throughout the description, isolation regions 66 are alternatively referred to as cut-metal isolation regions. Isolation regions 66 may be formed of, for example, silicon nitride, silicon oxide, or the like, and may be formed of a single layer or a composite layer including a plurality of layers.

Figure 10:
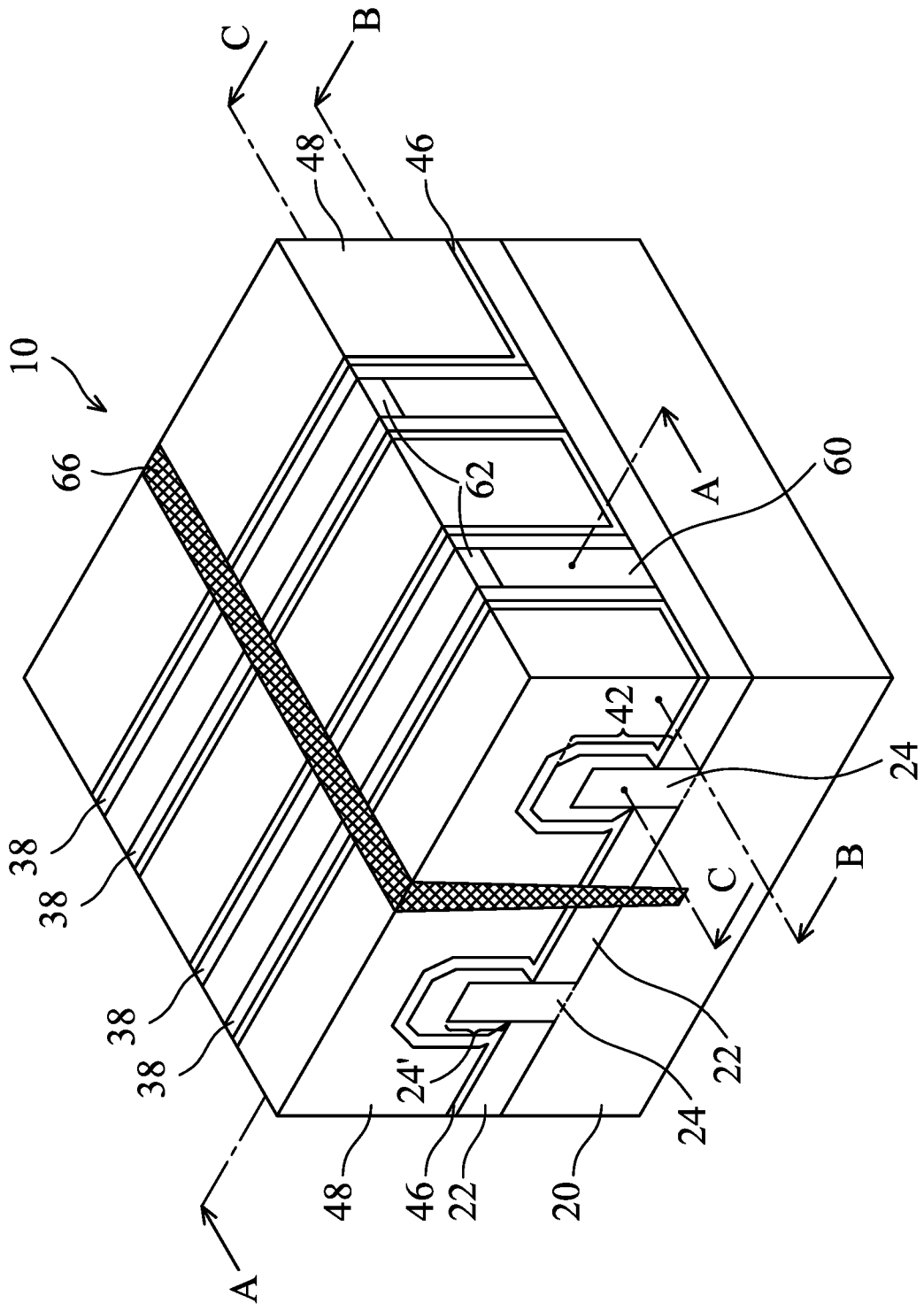

FIG. 10 illustrates a perspective view of one of isolation regions 66. The illustrated region in FIG. 10 includes region 63 as in FIG. 9. As shown in FIG. 10, isolation regions 66 may penetrate through ILD 48, CESL 46, hard masks 62, and gate stacks 60, and may extend into the bulk portion of substrate 20. The formation of isolation regions 66 may include etching ILD 48, CESL 46, hard masks 62, and gate stacks 60, and filling a dielectric material into the resulting recesses. The respective process for forming isolation regions 66 is illustrated as process 214 in the process flow as shown in FIG. 20.

Figure 11A:
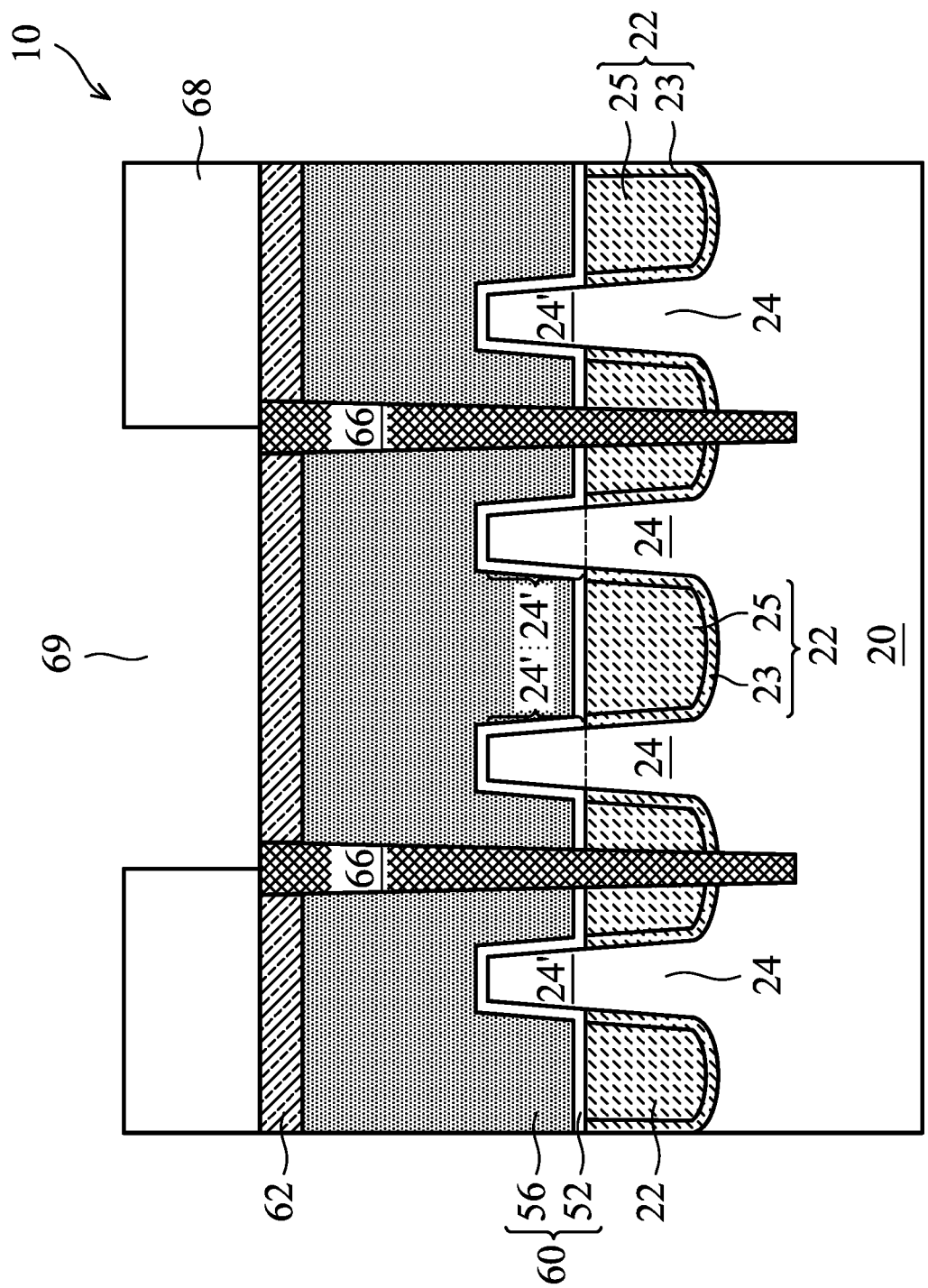
Figure 11B:
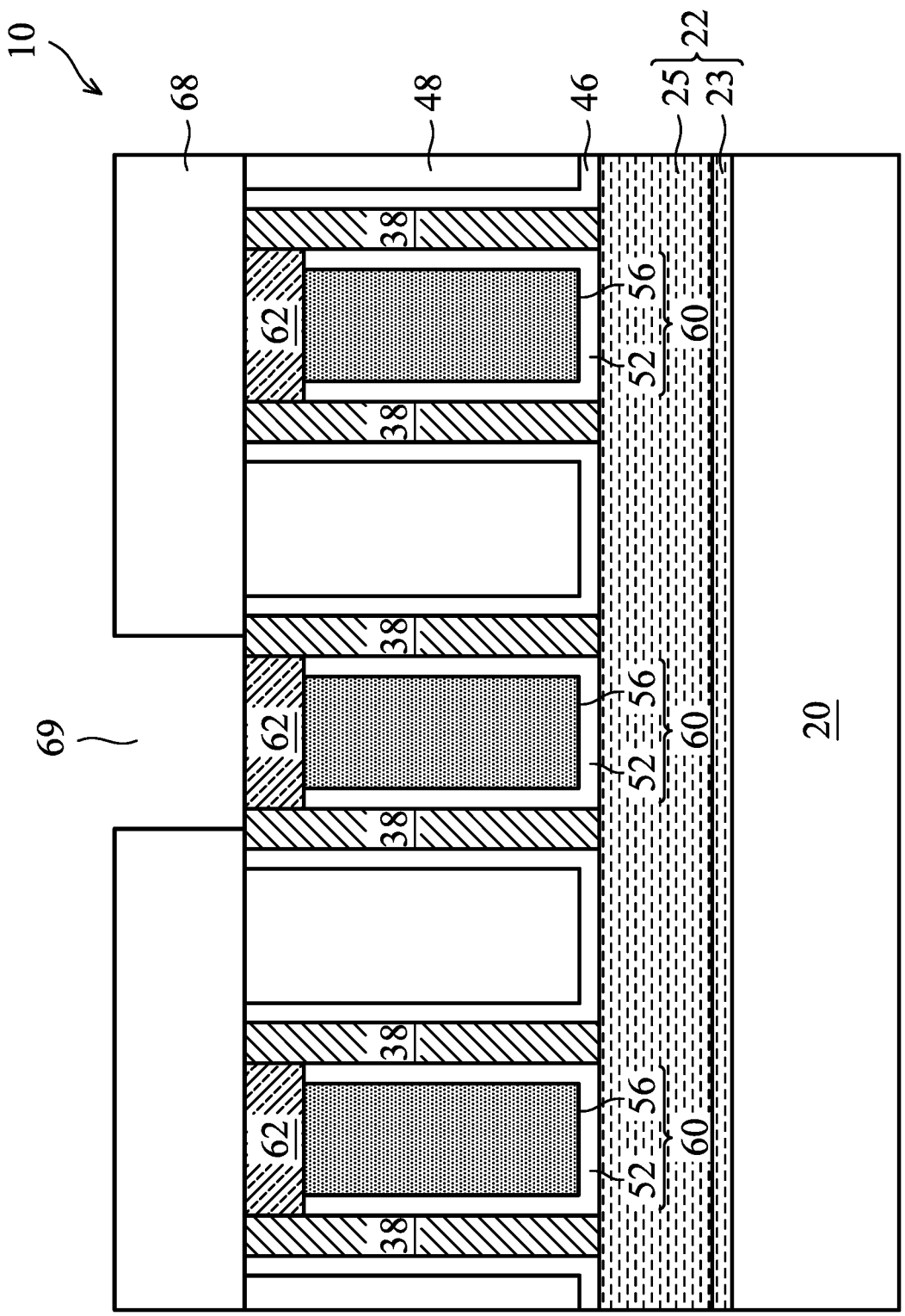
Figure 11C:
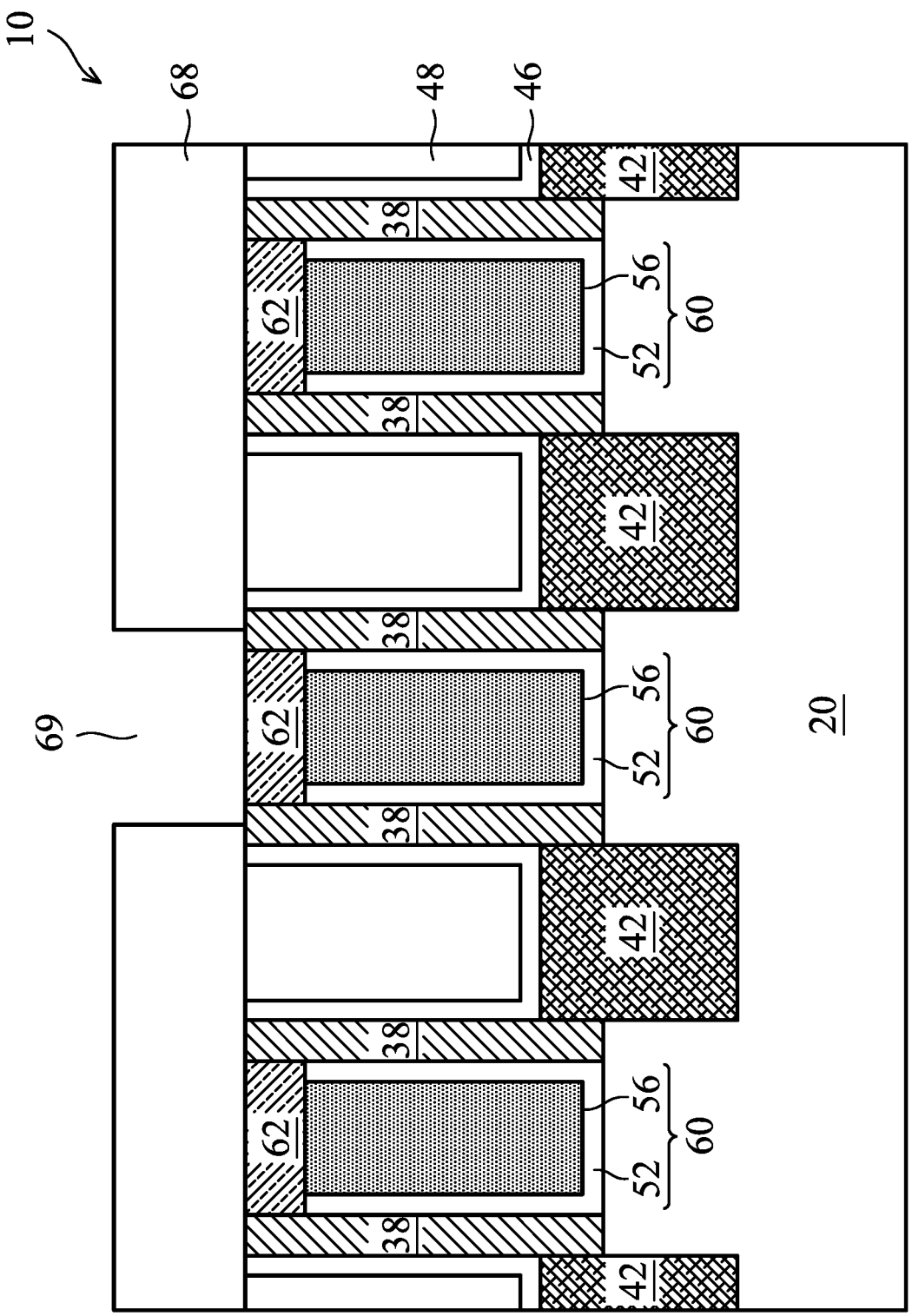

FIGS. 11A, 11B, and 11C through FIGS. 17A, 17B, and 17C illustrate the cross-sectional views of intermediate stages in the formation of isolation regions for cutting semiconductor fins 24' and semiconductor strips 24. The respective isolation regions are formed in regions 65 as shown in FIG. 9. In FIGS. 11A, 11B, and 11C through FIGS.

17A, 17B, and 17C, the figure numbers include letter "A," letter "B," or letter "C." The letter "A" indicates that the respective figure is a cross-sectional view obtained from the vertical plane same as the vertical plane containing line A-A in FIG. 9. The letter "B" indicates that the respective figures are obtained from the vertical plane same as the vertical plane containing line B-B in FIG. 9. The letter "C" indicates that the respective figures are obtained from the vertical planes same as the vertical plane containing line C-C in FIG. 9. The lines A-A, B-B, and C-C are also shown in FIG. 10.

Referring to FIGS. 11A, 11B, and 11C, patterned etching mask 68 is formed over the structure shown in FIGS. 9 and 10. The respective process is illustrated as process 216 in the process flow as shown in FIG. 20. In accordance with some embodiments, etching mask 68 includes a photo resist, a metal-containing hard mask such as a TiN layer, or the like. Opening(s) 69 are formed in etching mask 68 to reveal the underlying portions of gate stacks. Isolation regions 66 may have some portions revealed through openings 69. The size and the position of openings 69 are essentially the same as regions 65 shown in FIG. 9. As shown in FIG. 11A, some portions of protruding fins 24' are directly underlying opening 69. As shown in FIG. 11B, some portions of STI regions 22 are directly underlying opening 69. In accordance with some embodiments, as shown in FIGS. 11A and 11B, STI regions 22 include dielectric liner 23 and overlying dielectric region 25. In accordance with some embodiments, dielectric liner 23 is formed of silicon nitride, and the overlying dielectric regions 25 may be formed of silicon oxide, and other dielectric materials may also be used for forming dielectric liner 23 and dielectric region 25. In subsequent figures, the layers 23 and 25 in STI regions 22 are not illustrated, while these layers still exist. FIG. 11C illustrates source/drain regions 42 between gate stacks 60.

Figure 12A:
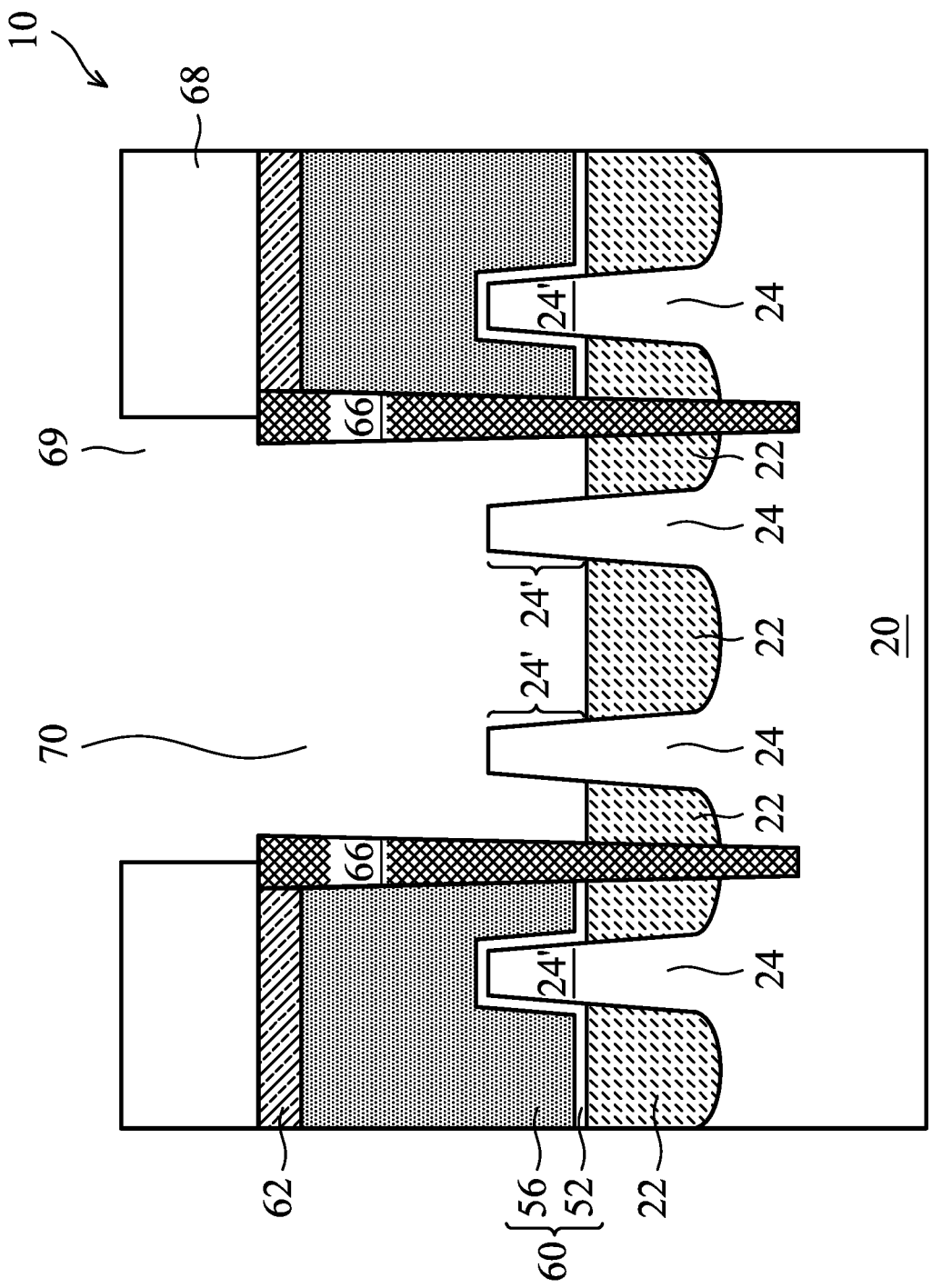
Figure 12B:
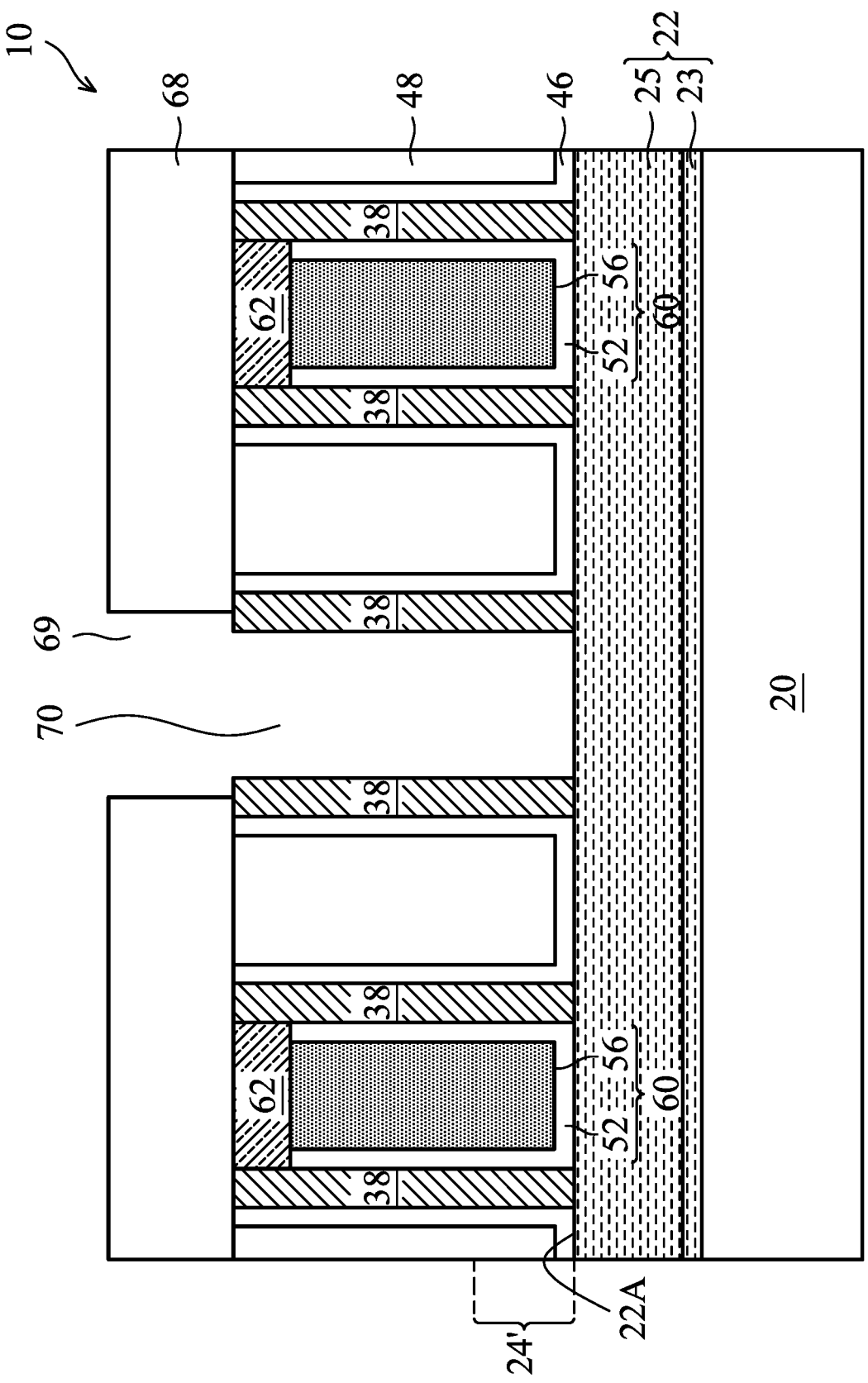
Figure 12C:
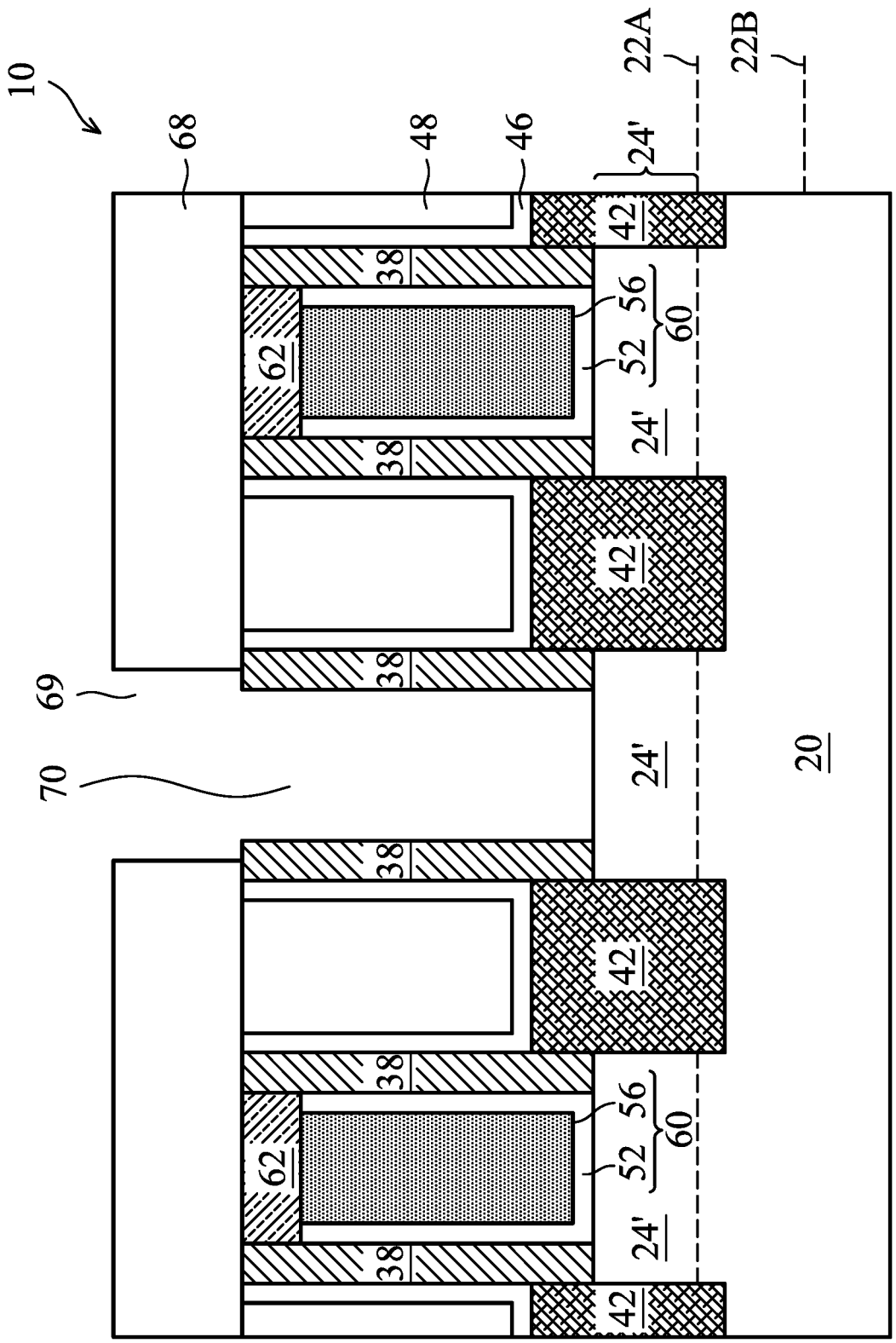

FIGS. 12A, 12B, and 12C illustrate the etching of hard mask 62 and gate stack 60 to form opening 70. The respective process is illustrated as process 218 in the process flow as shown in FIG. 20. The etching results in the removal of the portions of metal gate stack 60 exposed through opening 70. The etching may be performed through wet etch or dry etch. For example, when wet etch is adopted, Sulfuric Peroxide Mixture (SPM) solution, which is the solution of sulfuric acid and hydrogen peroxide, may be used to etch metal gate 56. Gate dielectric 52 may also be removed by the SPM solution. When dry etch is used, a mixture of $Cl_2$ and $BCl_3$ gases may be used. The etching may also be performed using process gases selected from, and not limited to, $Cl_2$, $SiCl_4$, $O_2$, $C_4F_6$, HBr, He, and combinations thereof. The dry etch may result in the removal of the gate electrode 56 and the high-k dielectric in gate dielectric 52 (FIG. 11A), and the interfacial layer in gate dielectric 52 may be left un-etched. FIGS. 12B and 12C illustrate the cross-sectional views obtained from the planes same as the plane containing lines B-B and C-C in FIG. 9 after the etching of gate stack 60, and STI regions 22 and semiconductor fins 24' (which are over top surface 22A of STI regions 22) are illustrated. As shown in FIG. 12C and some subsequent figures, the top surface 22A and bottom surface 22B of STI regions 22 are illustrated, and STI regions 22 will be at the level between top surface 22A and bottom surface 22B.

Figure 13A:
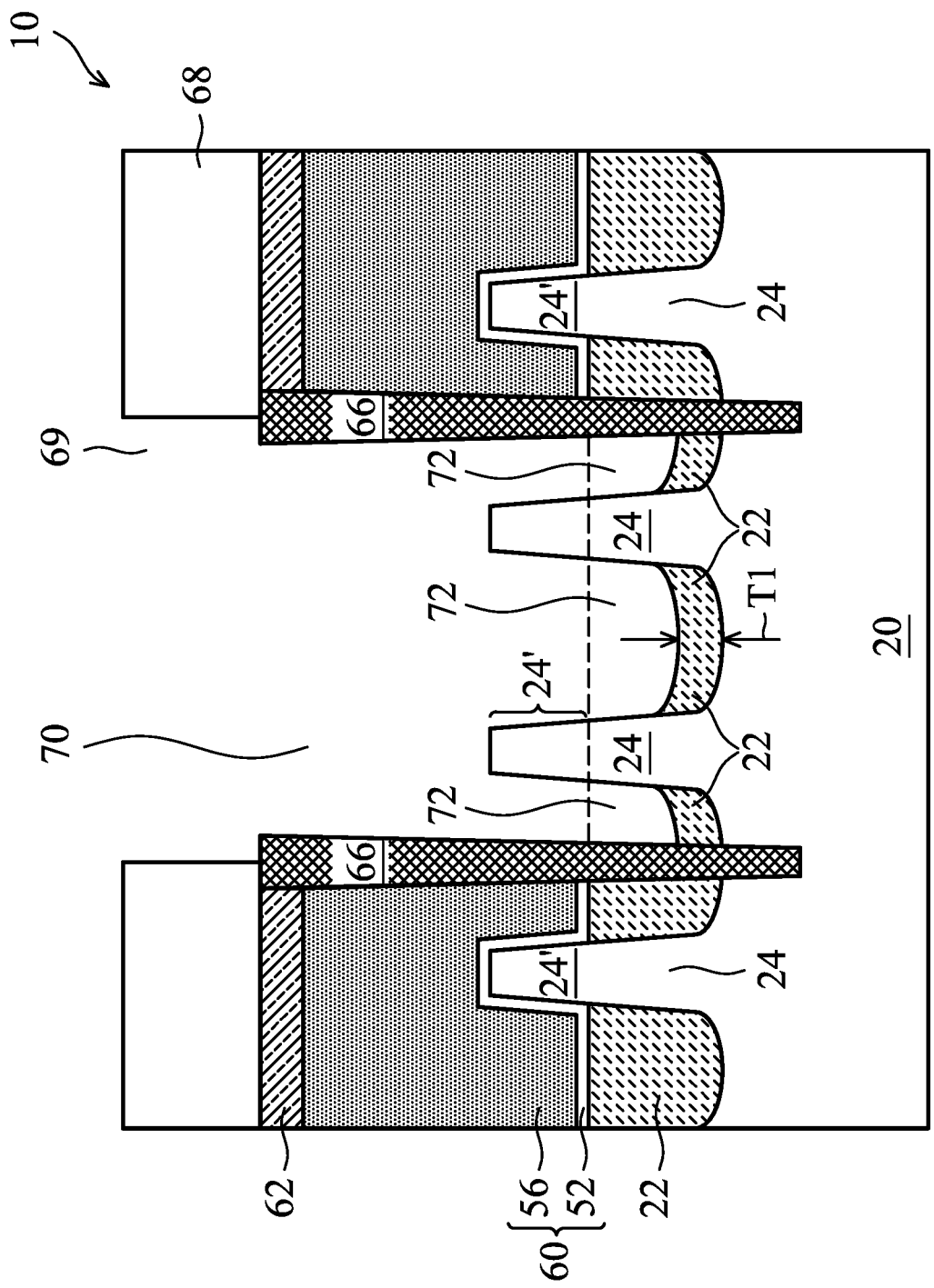
Figure 13B:
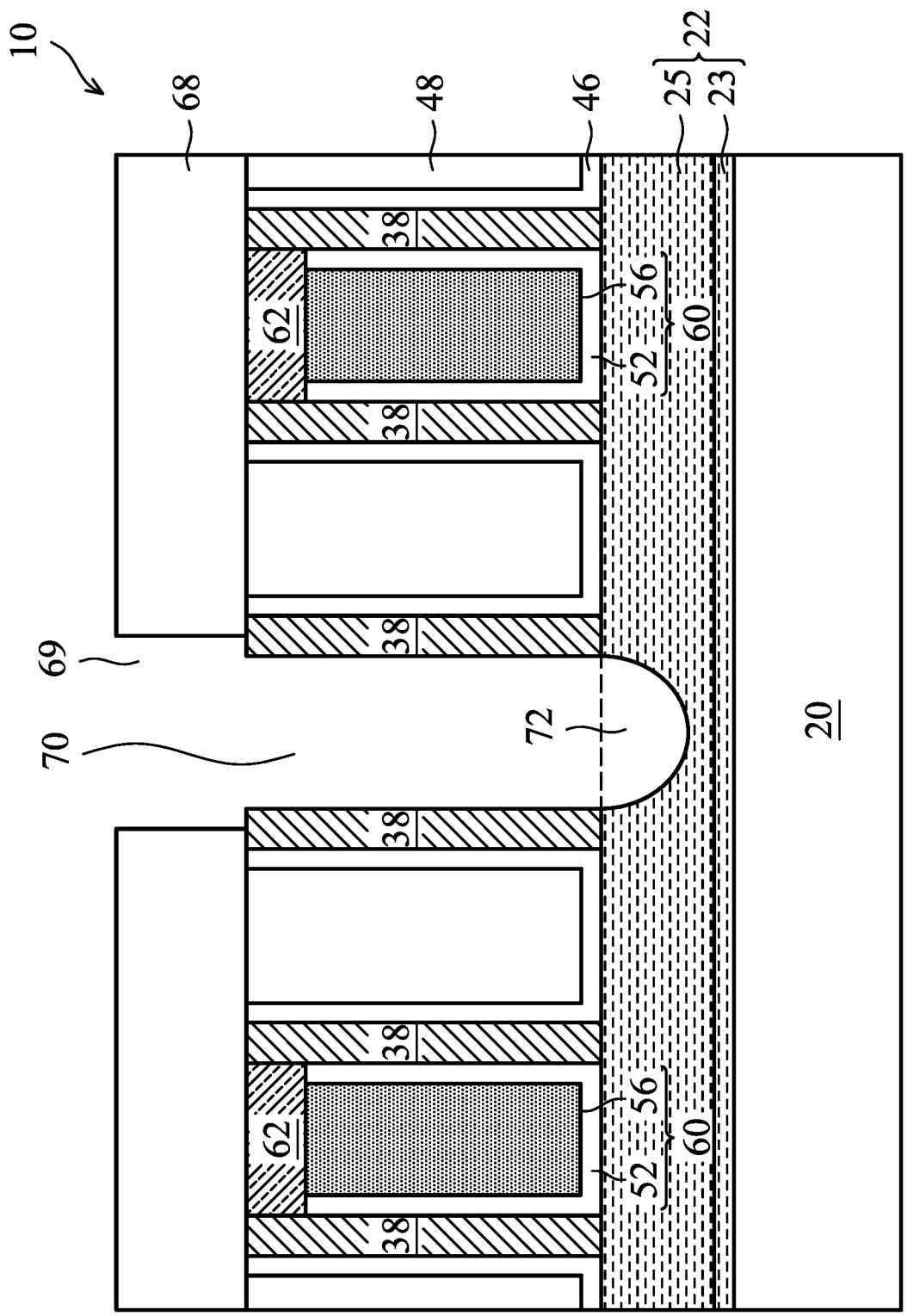
Figure 13C:
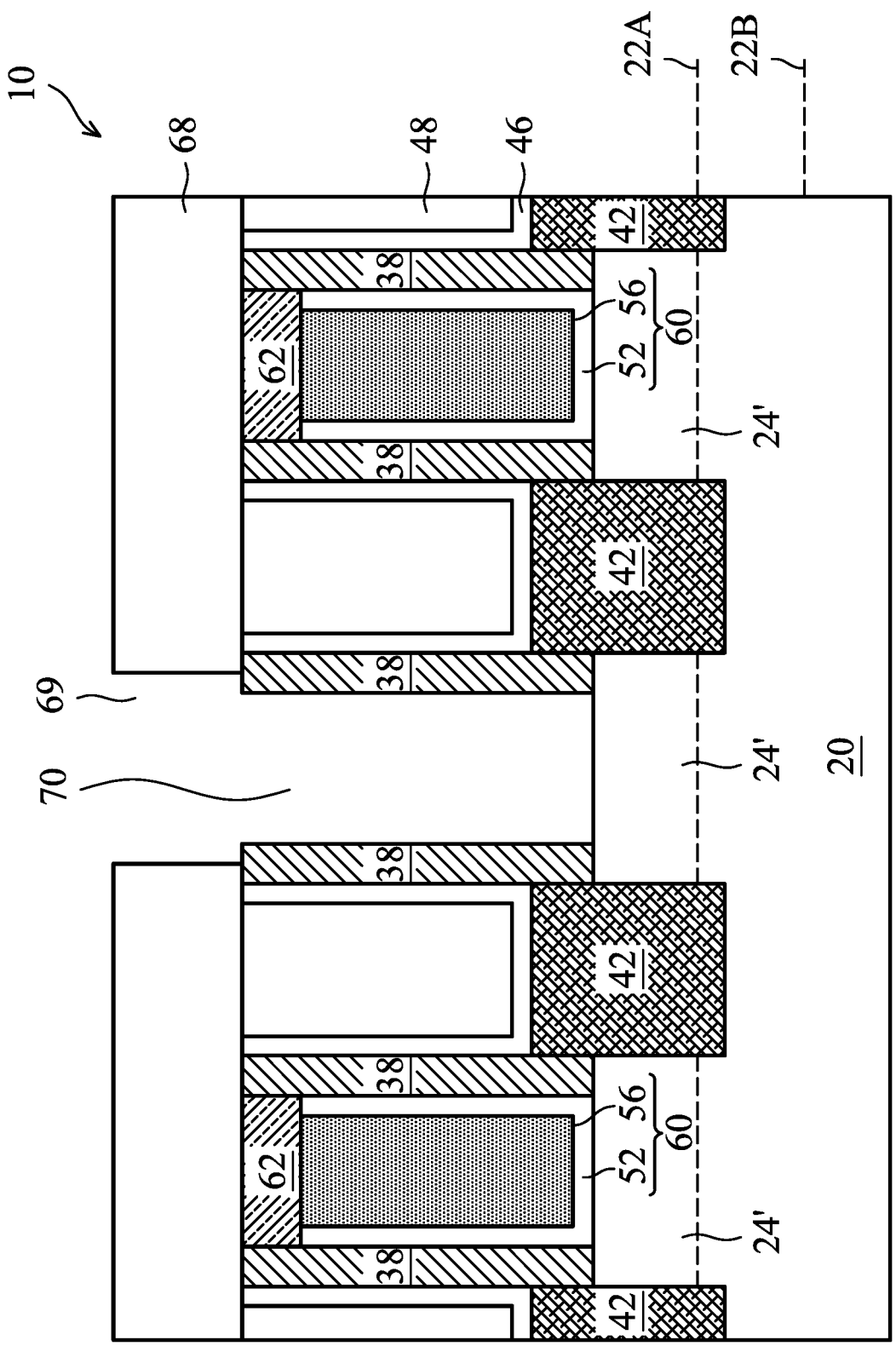

Referring to FIGS. 13A, 13B, and 13C, the exposed portions of STI regions 22 are recessed, forming recesses 72. The respective process is illustrated as process 220 in the process flow as shown in FIG. 20. In accordance with some embodiments of the present disclosure, the thickness T1 of the remaining portions of STI regions 22 is smaller than about 20 nm, and may be in the range between about 5 nm and about 20 nm. In accordance with some embodiments, an etchant is elected so that there is a high etching selectivity between STI regions 22 and fins/strips 24'/24, which etching selectivity may be greater than about 50, for example. The etchant may include etching gases such as the mixture of $CF_4$, $N_2$, and $H_2$, or the mixture of $C_4F_6$ and $O_2$. As shown in FIG. 13B, recess 72 extends into STI regions 22. In accordance with some embodiments of the present disclosure, the bottom of recess 72 is higher than the top surface of dielectric liner 23. The structure shown in FIG. 13C is the same as the structure shown in FIG. 12C.

Figure 14A:
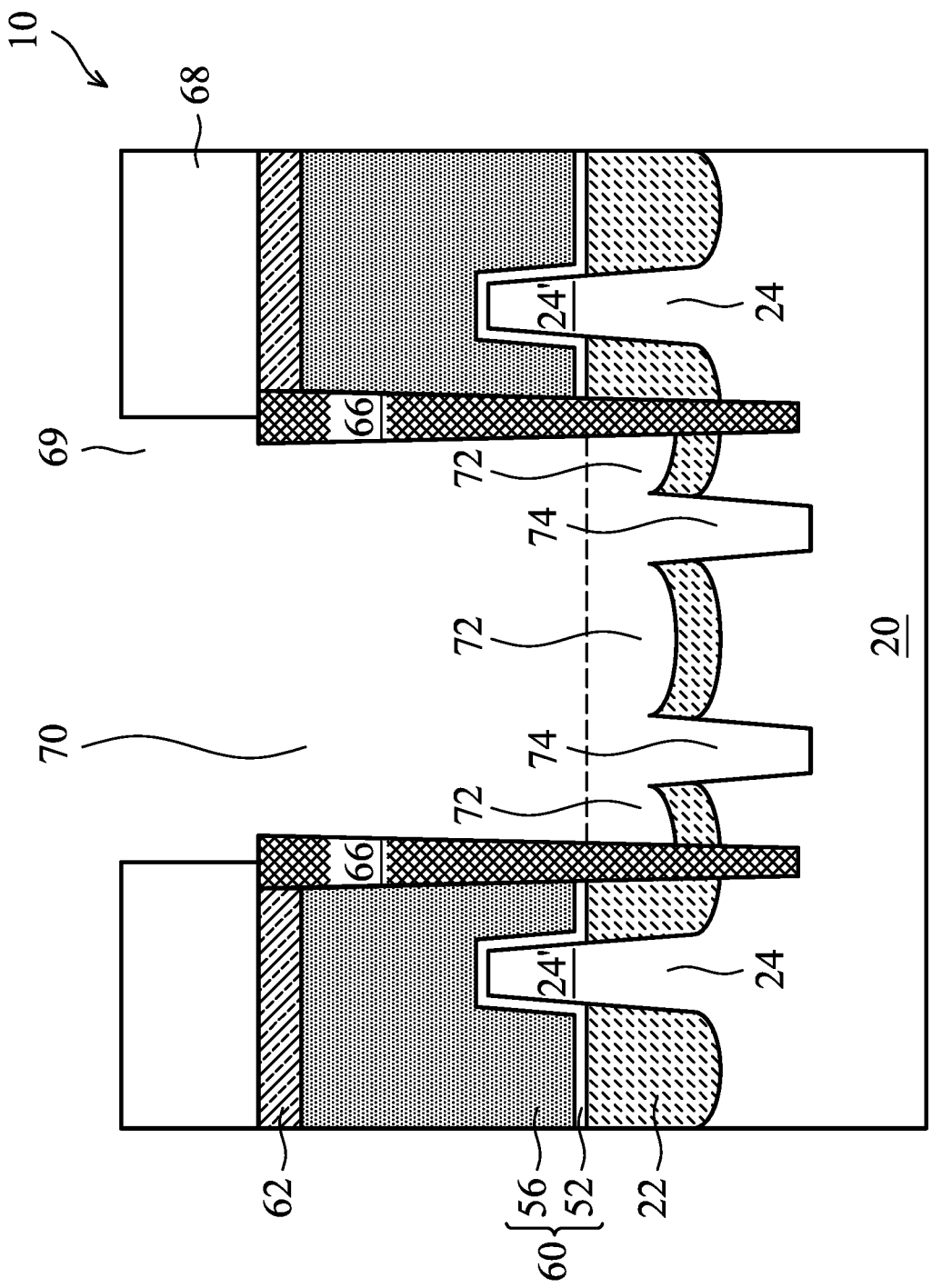
Figure 14B:
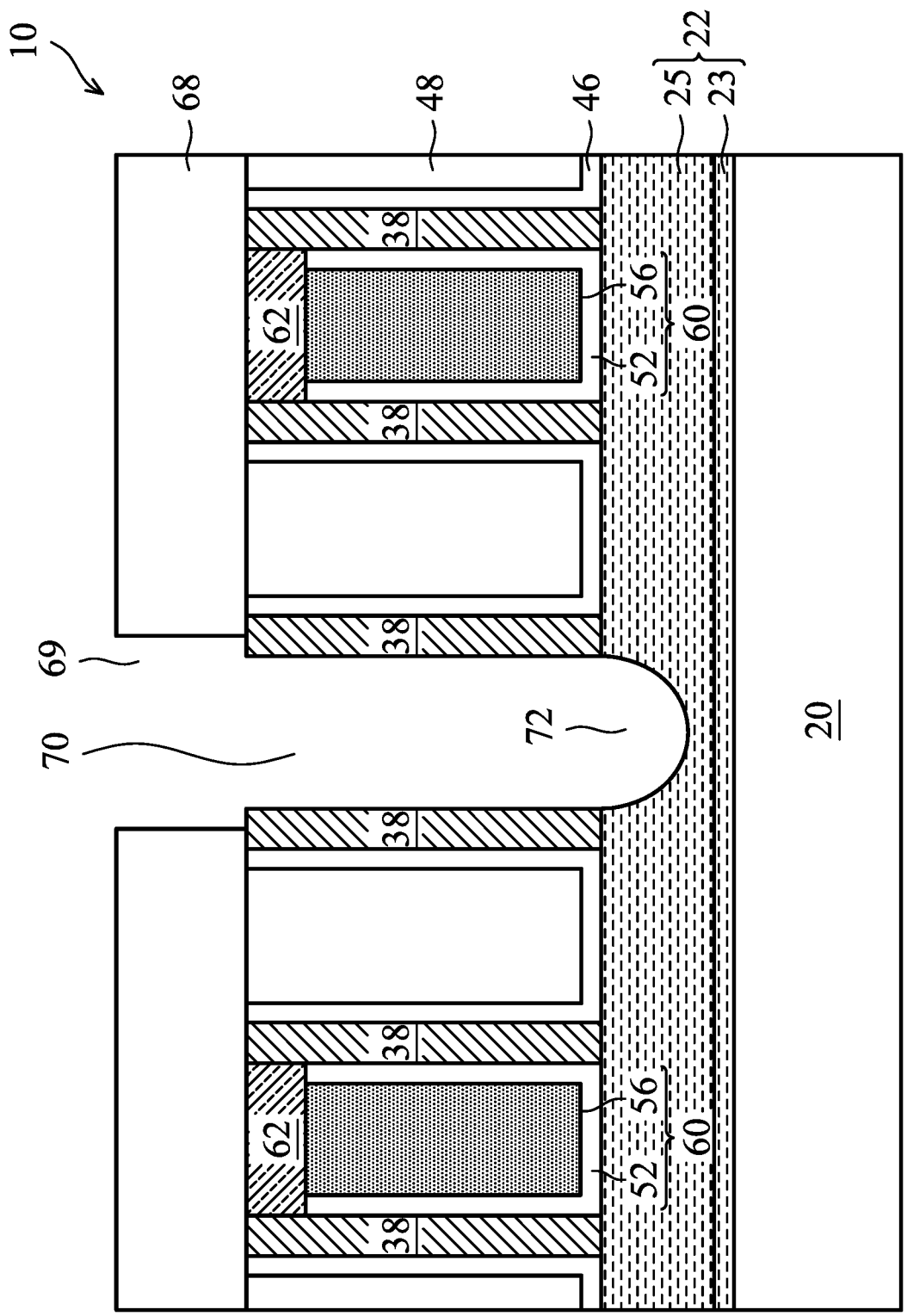
Figure 14C:
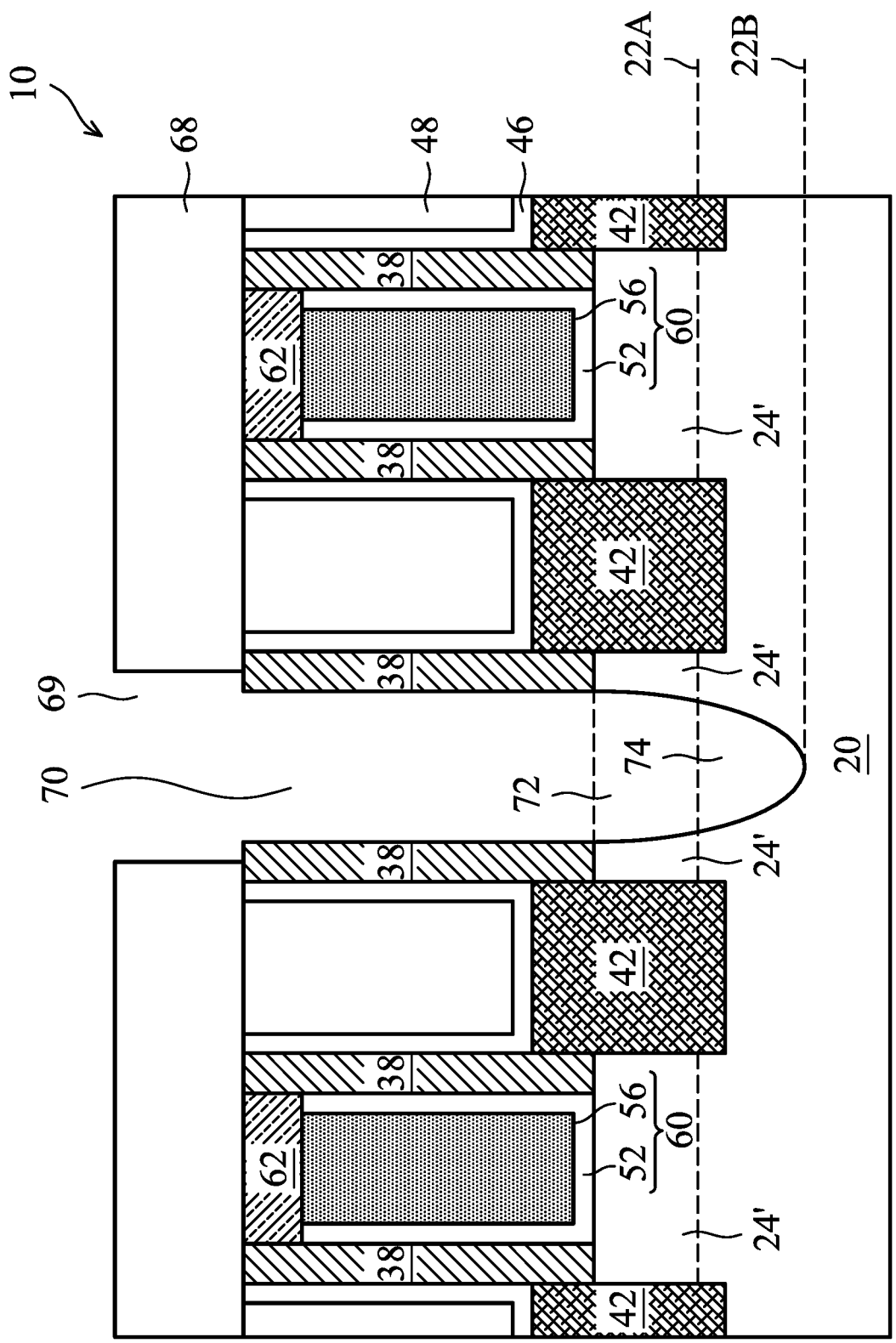

Protruding fins 24' (FIG. 13A) and the underlying semiconductor strips 24 are then etched, resulting in the structure shown in FIGS. 14A, 14B, and 14C. The respective process is illustrated as process 222 in the process flow as shown in FIG. 20. In addition, the portions of bulk substrate 20 underlying semiconductor strips 24 are also etched, so that recesses 74 are formed between the remaining portions of STI regions 22 and further extending into the bulk portion of substrate 20. The etchant is selected so that during the etching, STI regions 22 are substantially not etched. In accordance with some embodiments, the etchant includes a chlorine-based etching gas or an HBr-based etching gas. The etchant is selected so that there is a high etching selectivity between fins/strips 24'/24 and STI regions 22, which etching selectivity may be greater than about 50, for example. The etching gas may include a mixture of $Cl_2$, $SiCl_4$, and $O_2$, a mixture of $Cl_2$, $SiCl_4$, and $N_2$, a mixture of HBr, $O_2$, and Ar, or a mixture of HBr, $O_2$ and He. In FIG. 14C, it is shown that opening 74 penetrates through protruding fin 24'.

Figure 15A:
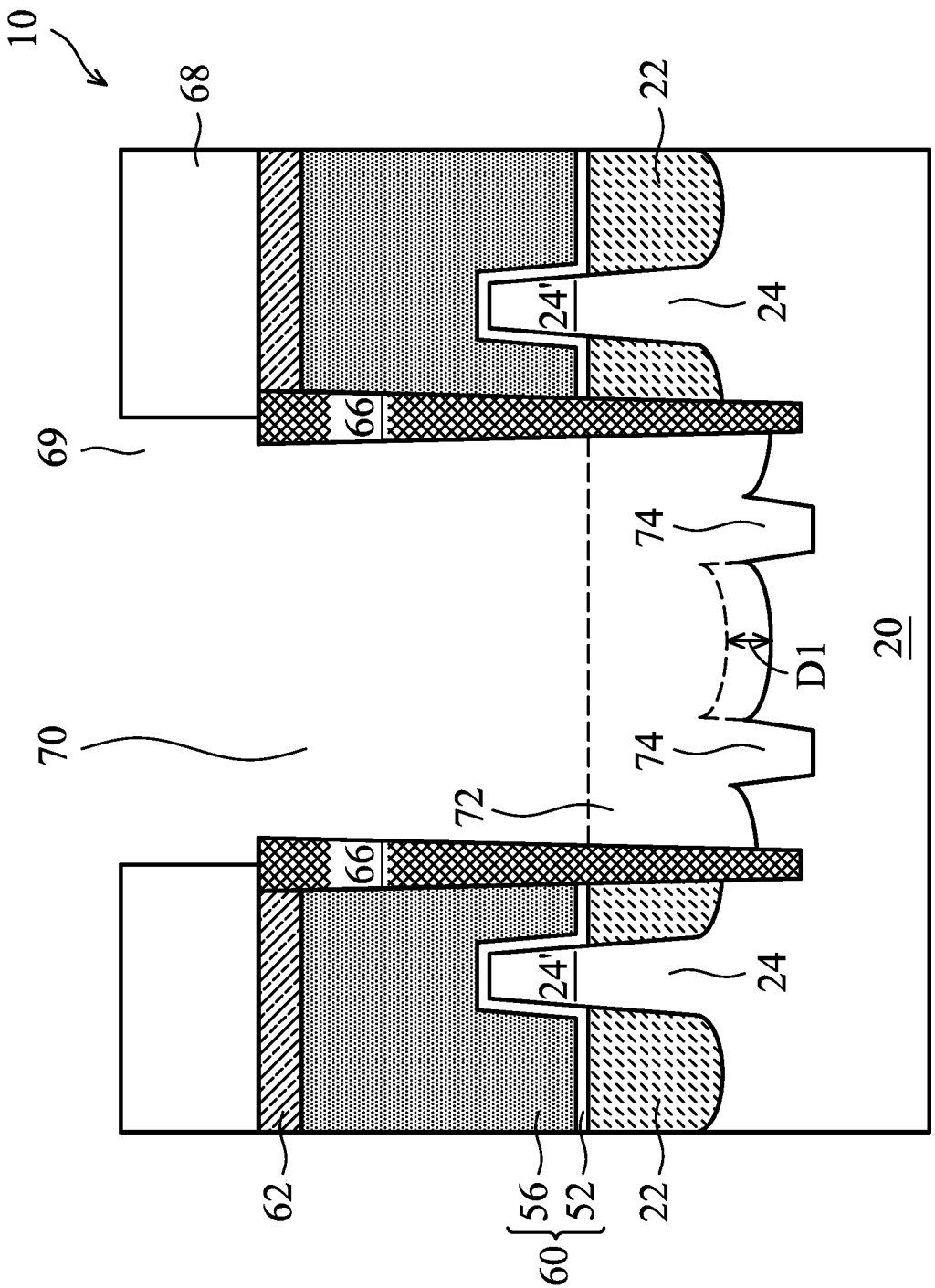
Figure 15B:
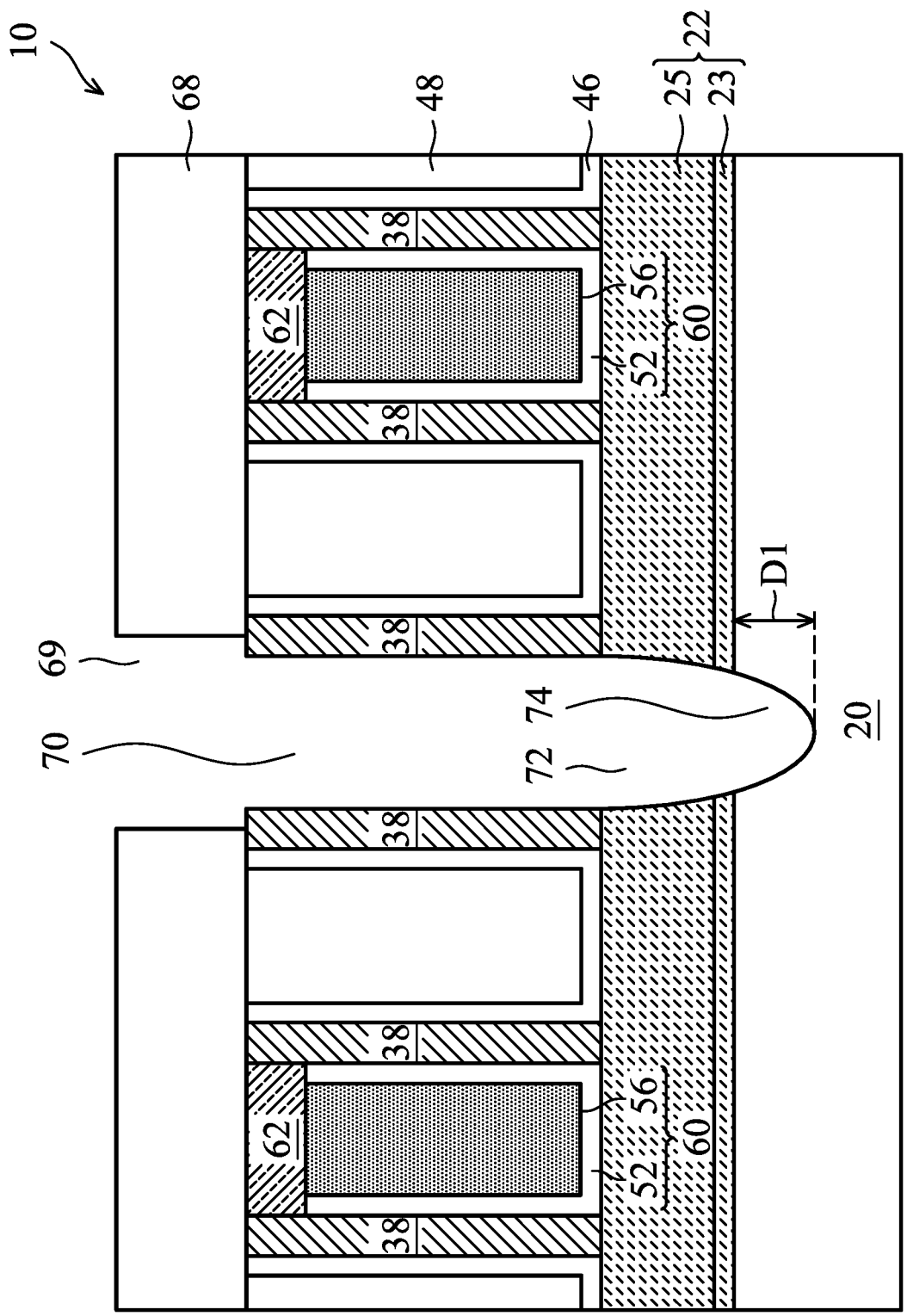
Figure 15C:
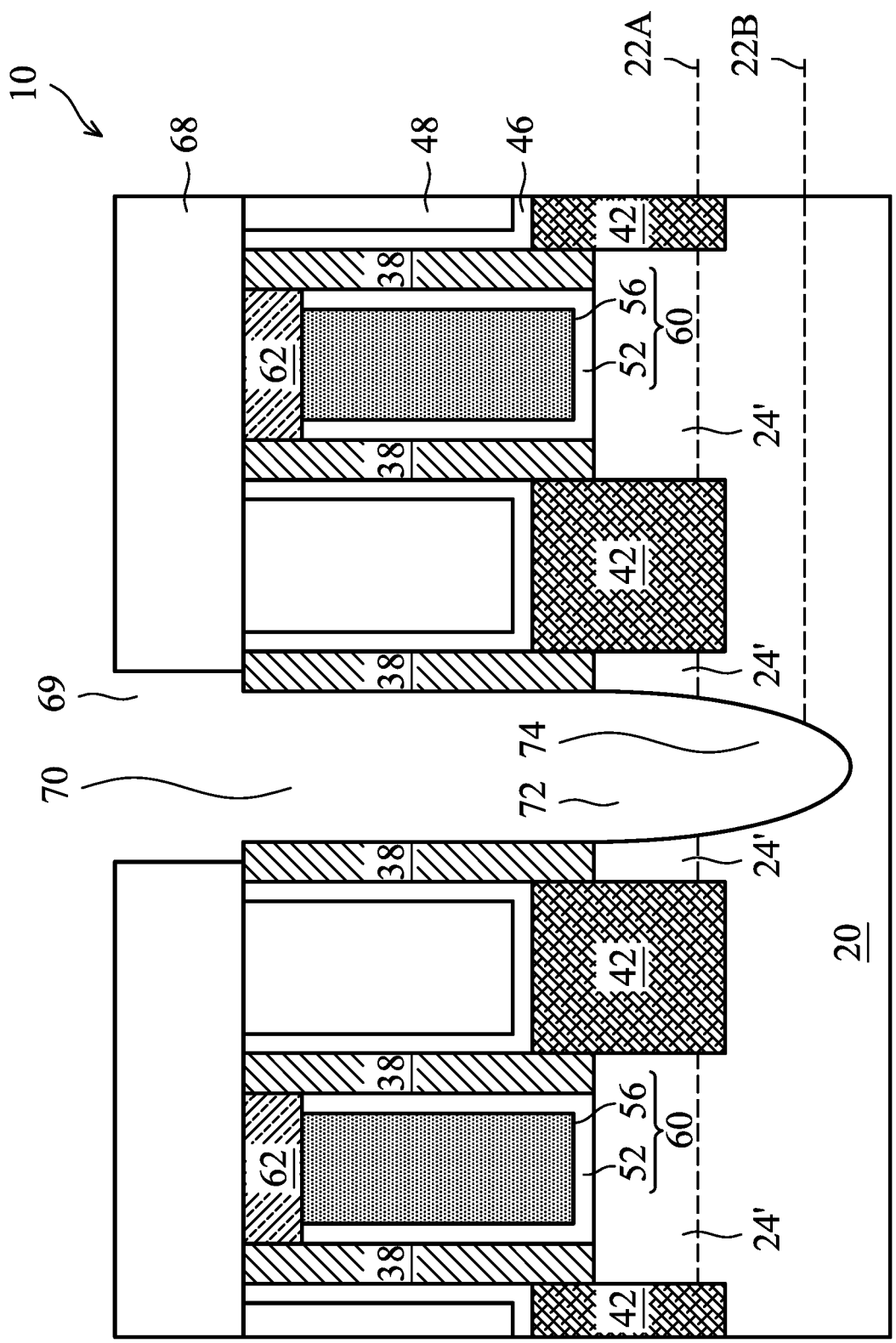

Next, the remaining portions of STI regions 22 are removed in an etching process, and the resulting structure is shown in FIGS. 15A, 15B, and 15C. The respective process is illustrated as process 224 in the process flow as shown in FIG. 20. As shown in FIG. 15A, all STI regions 22 (FIG. 14A) exposed to opening 69 are removed, and the underlying bulk substrate 20 is exposed. FIG. 15B illustrates that openings 72 and 74 penetrate through STI region 22. The structure shown in FIG. 15C is similar to the structure shown in FIG. 14C, except some portions of the bulk portion of substrate 20 may be recessed in the etching process. In accordance with some embodiments, as shown in FIG. 15B, the recessing of the bulk portion of substrate 20 causes opening 74 to extend into the bulk portion of substrate 20 for depth D1, which may be greater than about 1 nm, and may be in the range between about 1 nm and about 150 nm. Etching mask 68 is then removed.

Figure 16A:
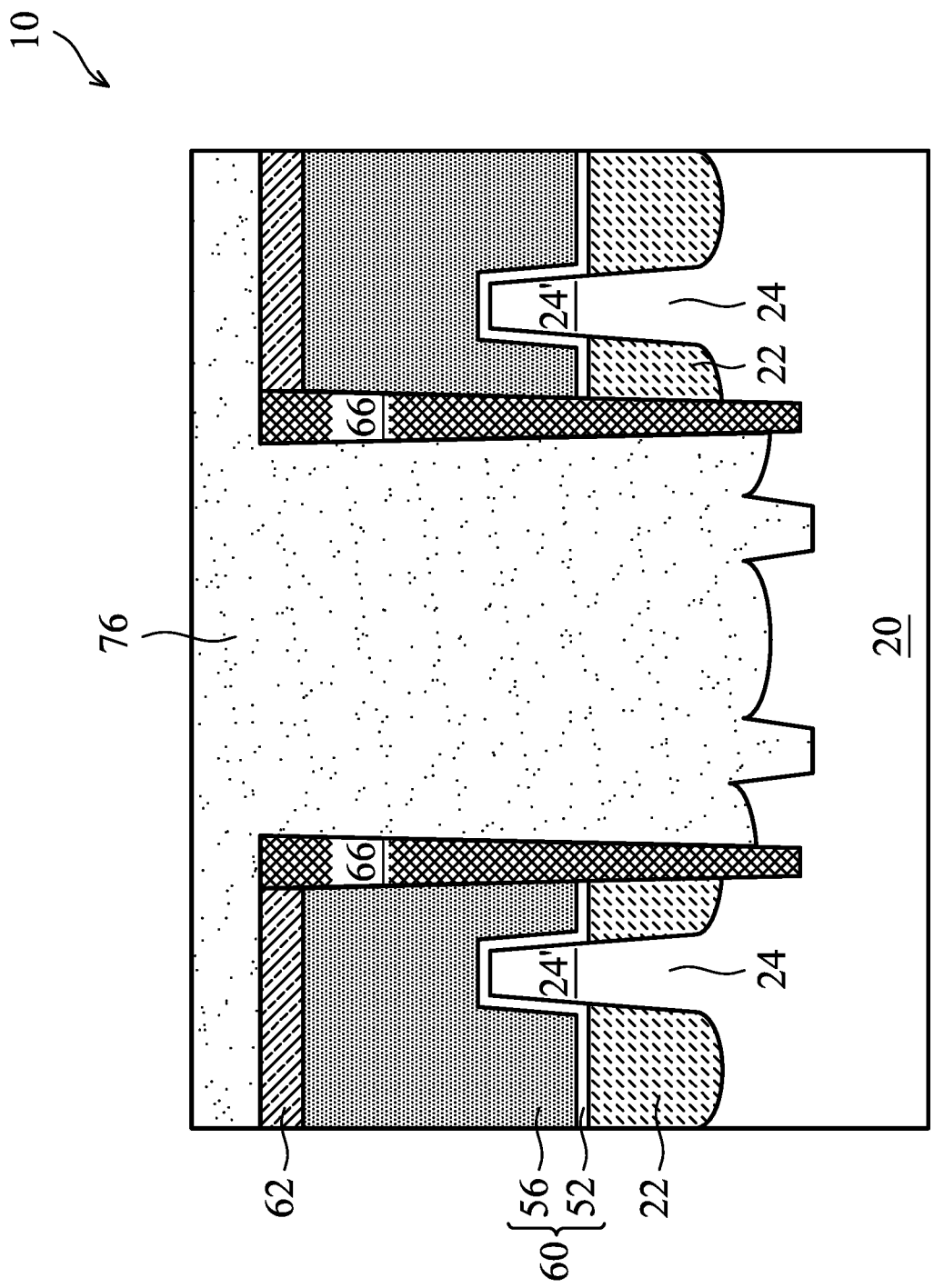
Figure 16B:
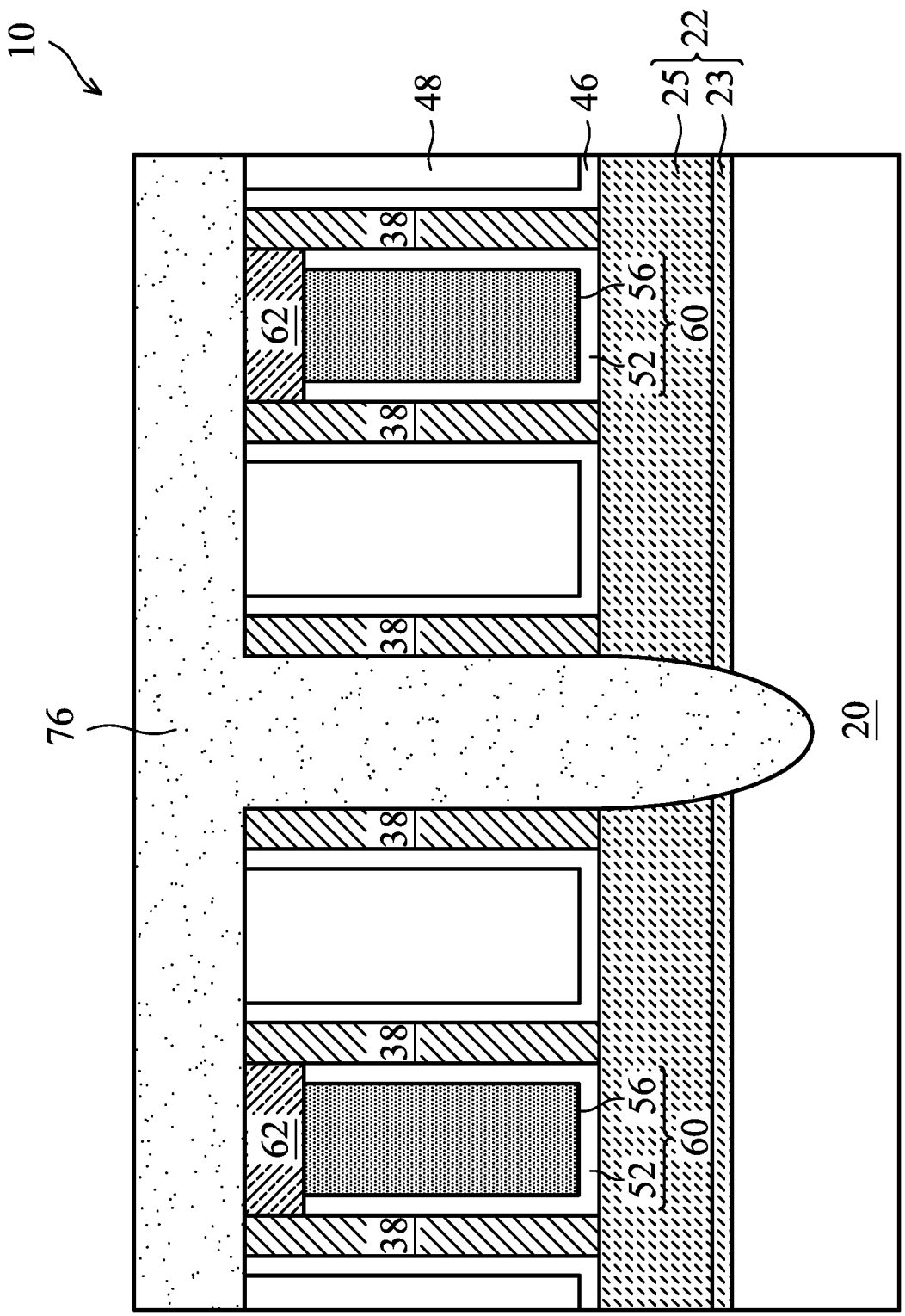
Figure 16C:
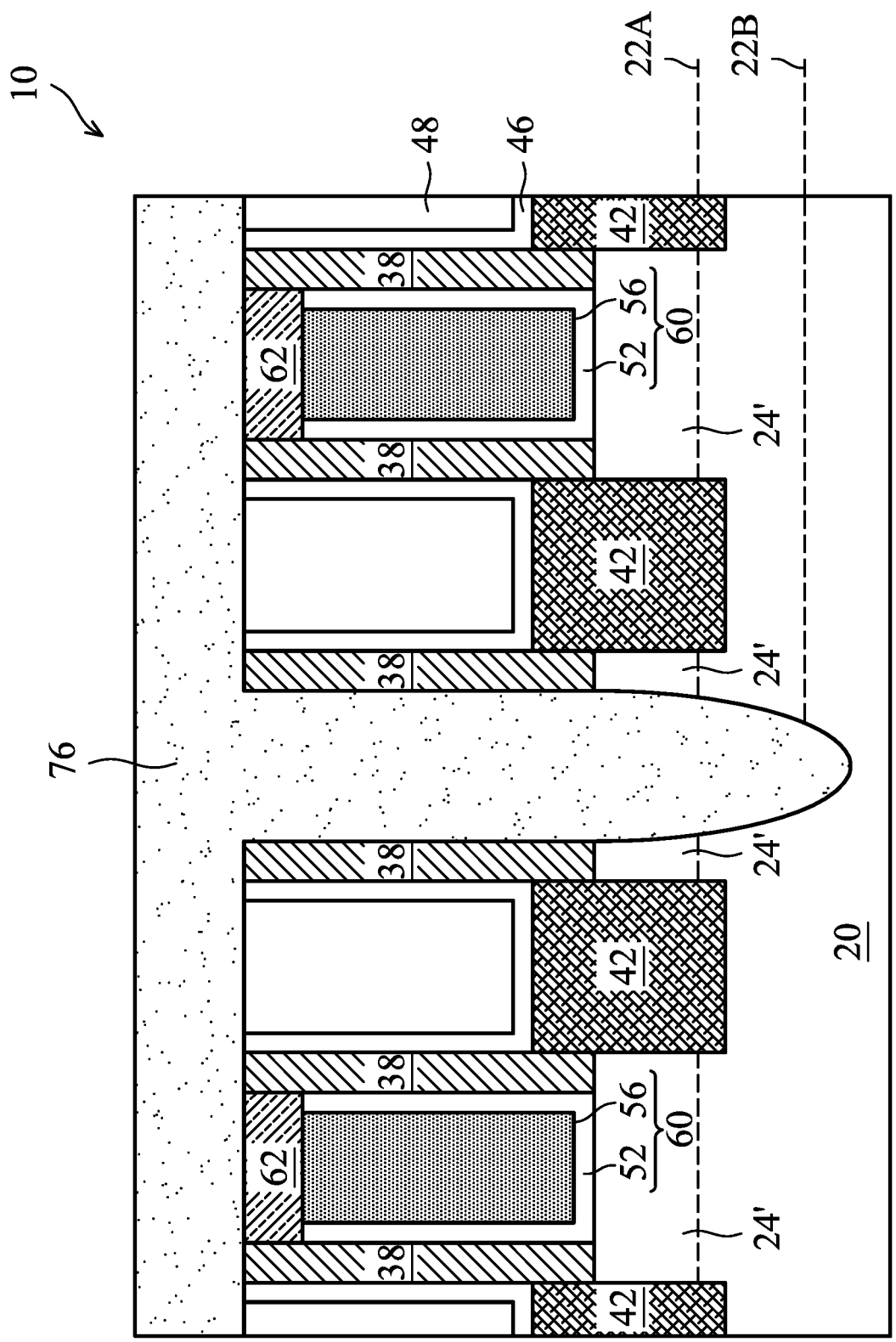

FIGS. 16A, 16B, and 16C illustrate the deposition of dielectric isolation region 76, which is alternatively referred to as cut-fin isolation region 76. The respective process is illustrated as process 226 in the process flow as shown in FIG. 20. The formation of dielectric isolation region 76 may include depositing a dielectric material into openings 70, 72, and 74 (FIGS. 15A, 15B and 15C). The deposition method may include Atomic Layer Deposition (ALD), Low-Pressure Chemical Vapor Deposition (LPCVD), spin-on coating, Plasma Enhanced Chemical Vapor Deposition (PECVD), or the like. The deposited dielectric material 76 may include silicon oxide, silicon carbide, silicon oxy-carbide, or other types of low-defect-density dielectric material. In accordance with some embodiments, deposited dielectric material 76 includes a liner, which is formed of a non-SiN material such as silicon oxide, and a filling dielectric material over the liner. The filling dielectric material may be formed of SiN or a non-SiN material. In accordance with some embodiments, an entirety of dielectric material 76 is formed of a non-SiN dielectric material such as silicon oxide. Using a non-SiN material to form the liner of dielectric isolation region 76 may advantageously prevent the leakage in substrate 20, as will be discussed in subsequent paragraphs.

Figure 17A:
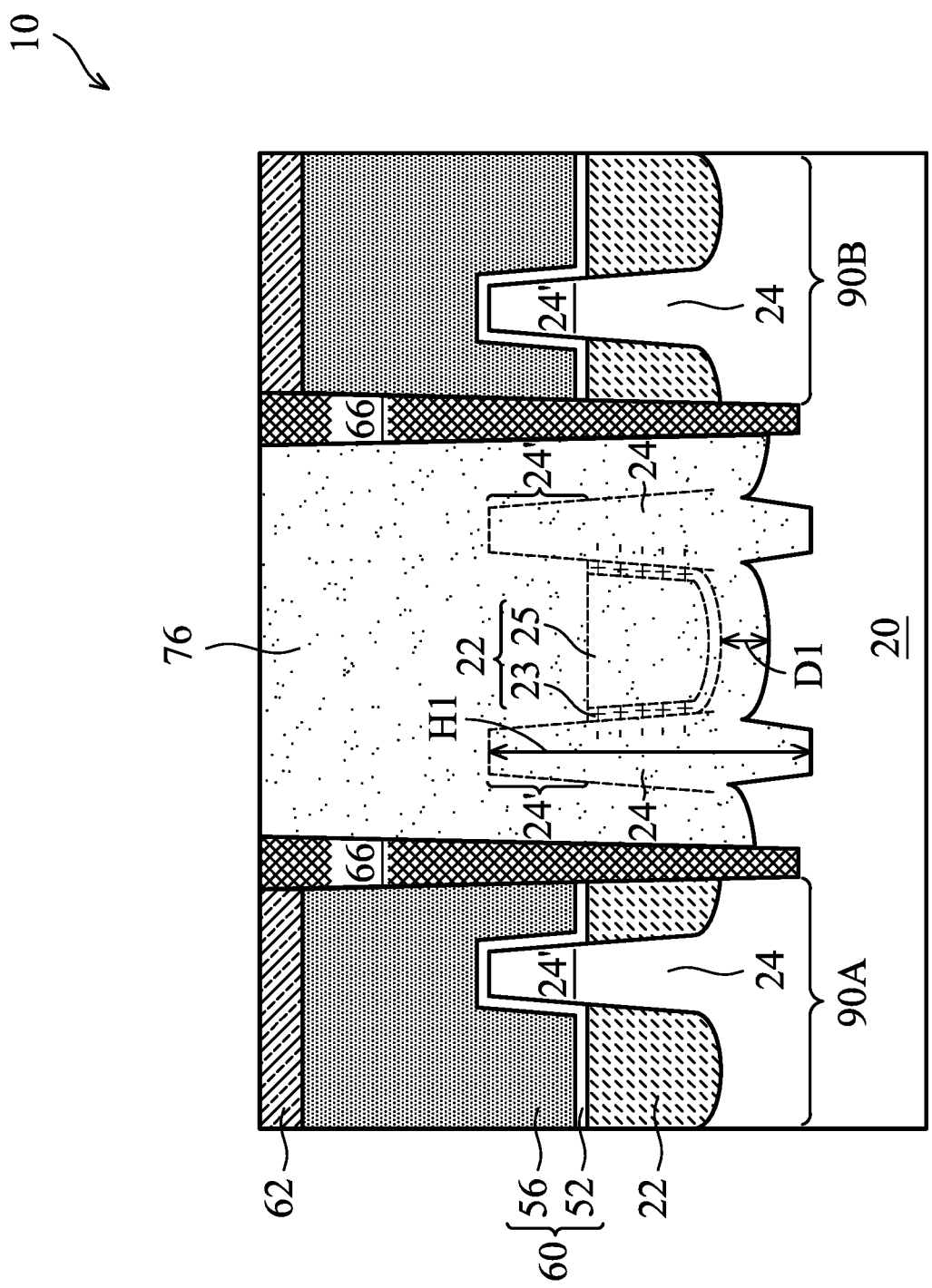
Figure 17B:
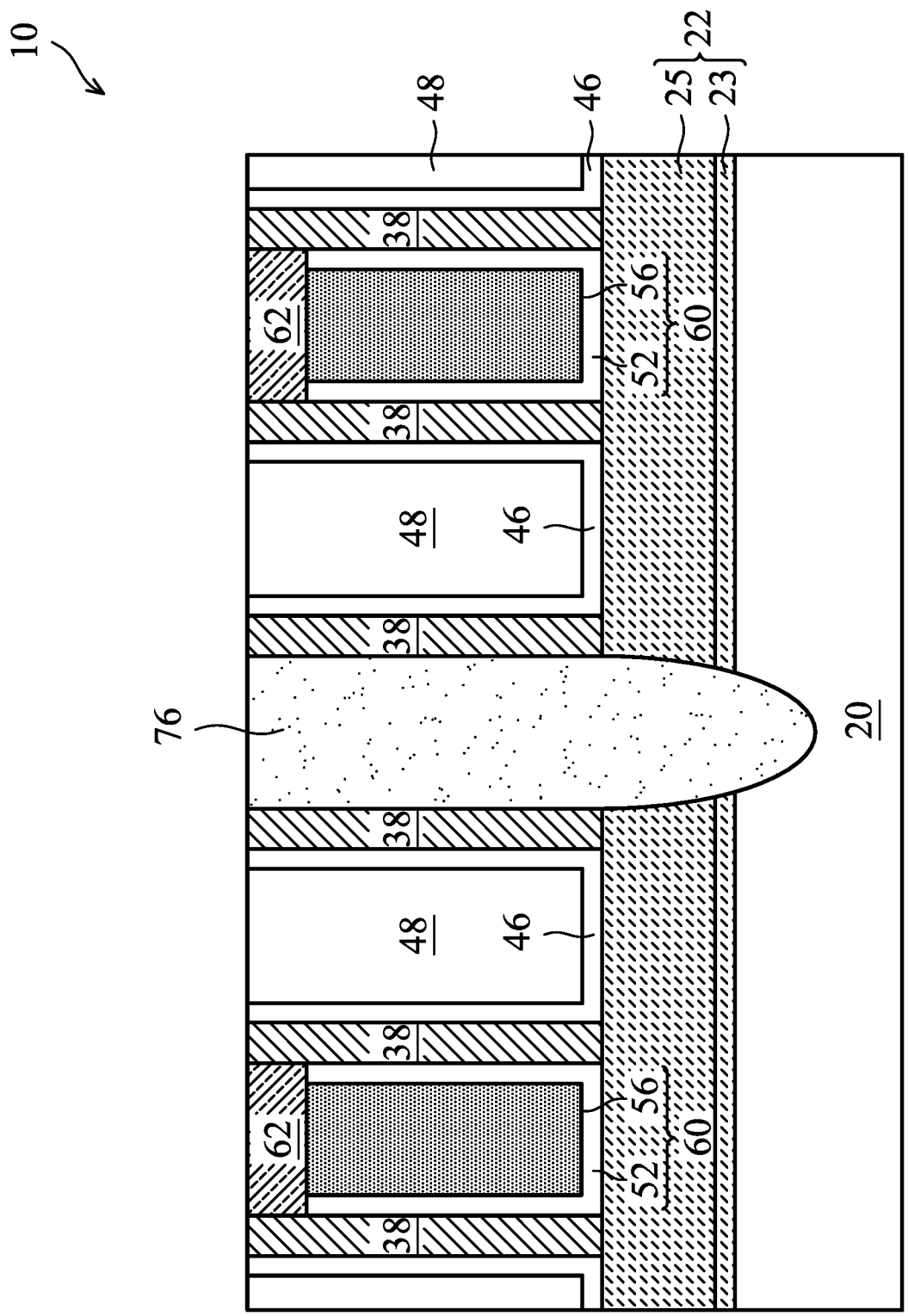
Figure 17C:
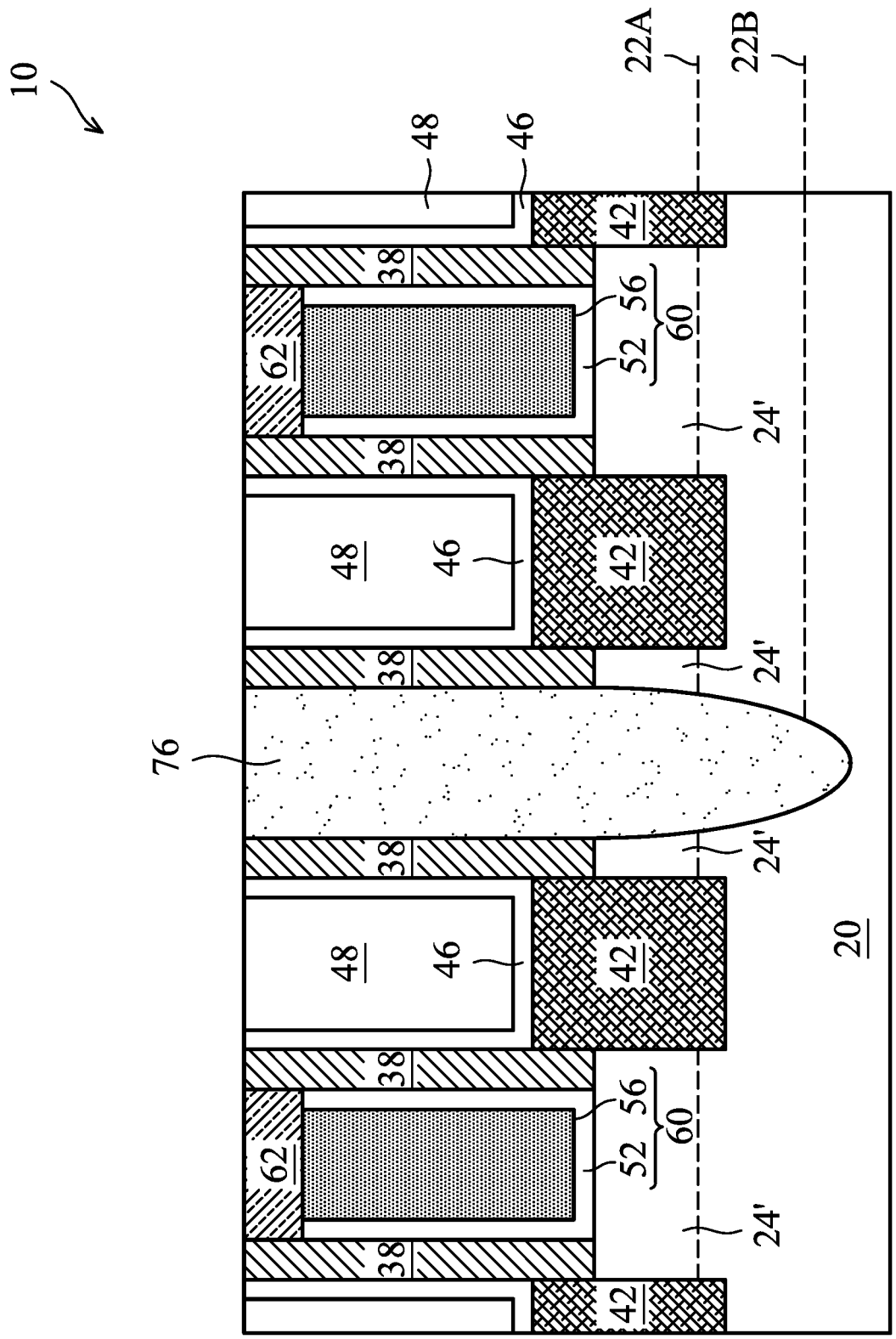

FIGS. 17A, 17B, and 17C illustrate a planarization process such as a CMP process or a mechanical grinding process to remove the excess portions of isolation region 76. In accordance with some embodiments of the present disclosure, hard masks 62 are used as a stop layer for the planarization process. In subsequent processes, source/drain silicide regions, source/drain contact plugs, gate contact plugs, etc. (not shown) are formed to finish the formation of FinFETs 90A and 90B (FIG. 18).

In FIG. 17A, the removed portion of STI region 22 and the removed portions of protruding fins 24' and strips 24 are shown using dashed lines. As shown in FIG. 17A, the bottom of isolation region 76 is recessed lower than the bottoms of STI regions 22 by distance D1, which may be greater than about 1 nm, and may be in the range between about 1 nm and about 150 nm. If distance D1 is smaller than about 1 nm, the process may face the risk of having residue dielectric liner 23 remaining, which causes leakage currents. If distance D1 is greater than about 150 nm, the formation of well regions (which may be p-well regions) may incur problems. Isolation region 76 may extend from the top of protruding fins 24' downwardly for height H1, which may be in the range between about 80 nm and about 250 nm. If height H1 is smaller than about 80 nm, semiconductor strips 24 (FIG. 11A) may not be able to be removed fully when process variation occurs, and hence leakage will occur in semiconductor strips 24. If height H1 is greater than about 250 nm, the formation of well regions may incur problems.

Figure 18:
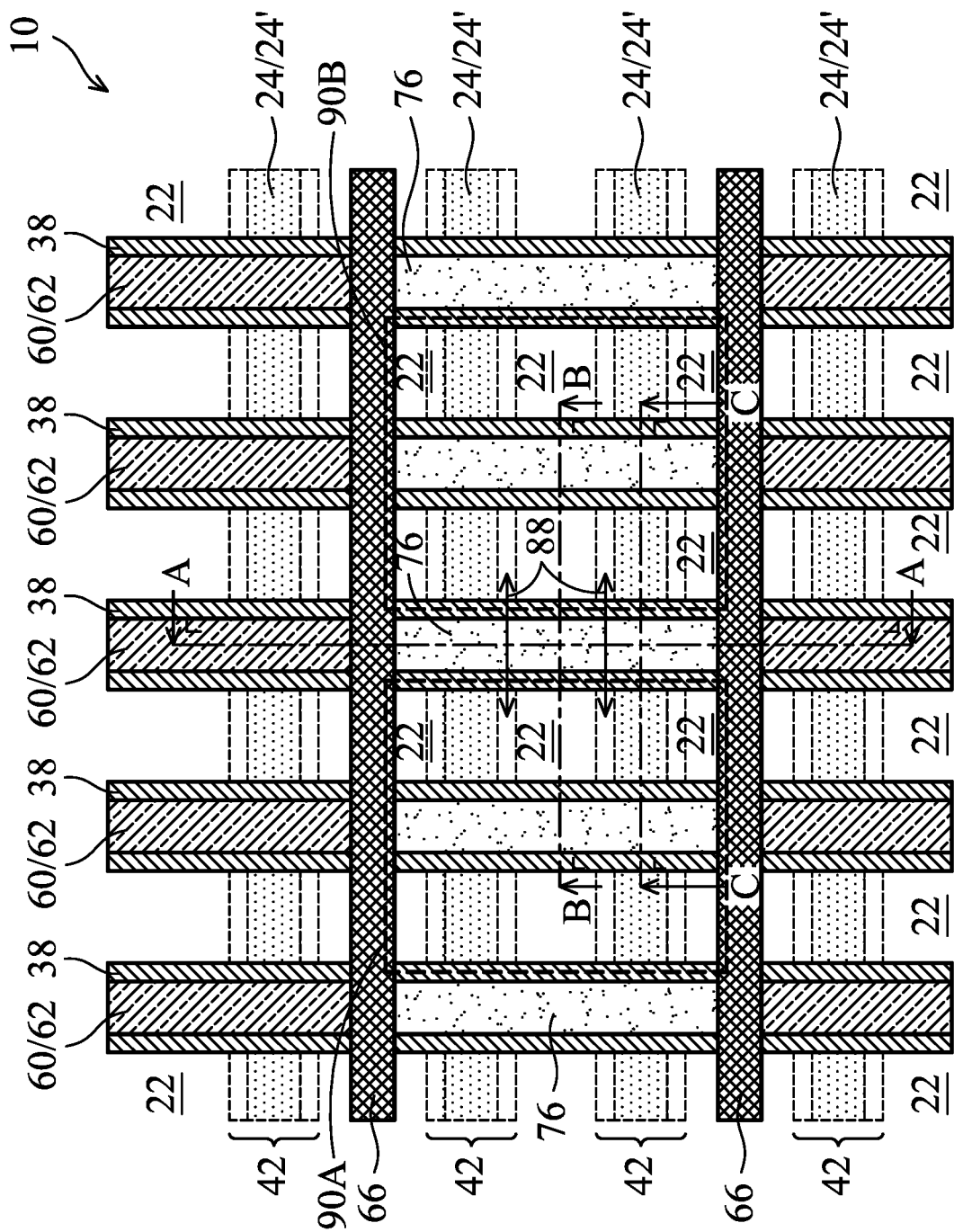

FIG. 18 illustrates a top view of the resulting structure, in which FinFETs 90A and 90B are formed as the result of the preceding processes. FinFETs 90A and 90B are defined by isolation regions 66 and 76. Isolation regions 76 separate the source/drain regions of FinFETs such as 90A and 90B from each other. Isolation regions 66 separate the gate stacks of FinFETs such as 90A and 90B from the gate stacks of neighboring FinFETs. It is appreciated that the layout, the size, and the positions of isolation regions 66 and 76 may be different from what are illustrated. For example, isolation regions 66, instead of being cutting a plurality of gate stacks 60, may include a plurality of separate shorter portions, each cutting one of gate stacks 60.

The isolation regions 76 as formed in accordance with some embodiments of the present disclosure have the advantageous feature of eliminating leakage currents. Referring again to FIG. 17A, the position of the removed dielectric liner 23 is illustrated. When dielectric liner 23 is not removed, and is formed of some defect-prone dielectric materials such as silicon nitride, positive charges (as schematically illustrated using "+" signs) are trapped in dielectric liner 23. The trapped positive charges attract negative charges (schematically illustrated using "−" signs) to a thin surface layer in semiconductor strips 24 (which are illustrated using dashed lines since they are removed). The negative-charge-accumulated layer thus forms a leakage path, which extends in the direction into or out of the plane as illustrated in FIG. 17A. The leakage paths are also illustrated by arrows 88 in FIG. 18. The leakage paths affect n-type FinFETs since the dominant carrier of n-type FinFETs are electrons. An advantageous feature in accordance with some embodiments of the present disclosure is that the STI region 22 as illustrated using dashed lines in FIG. 17A is removed, and hence the leakage paths are eliminated.

Figure 19:
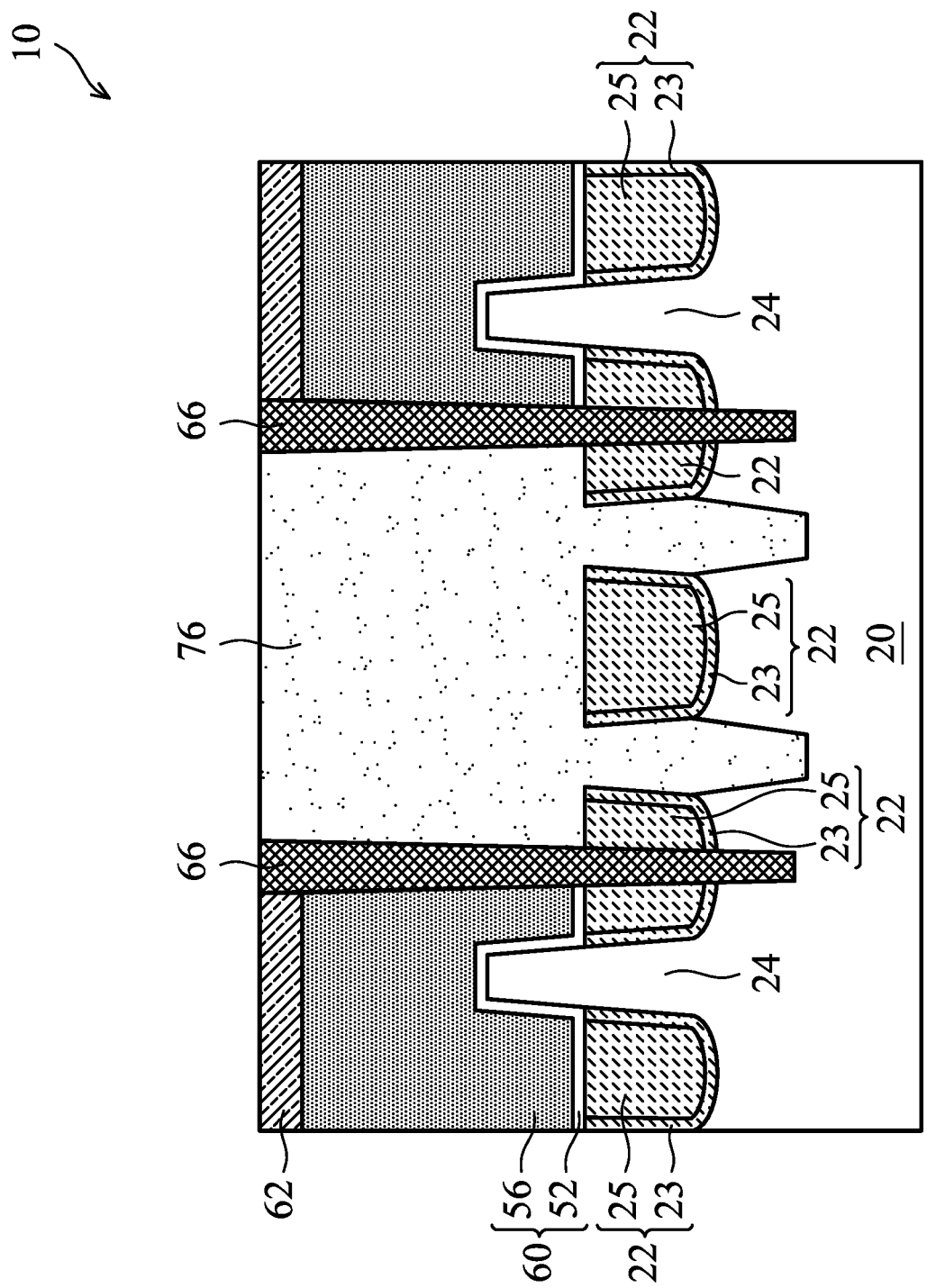
FIG. 19 illustrates the cross-sectional views of a p-type FinFET in accordance with some embodiments.

Referring to FIG. 18, in accordance with some embodiments of the present disclosure, FinFETs 90A and 90B are both n-type FinFETs. On the same die and same wafer, there may be p-type FinFETs that may have essentially the same or similar top-view structure as shown in FIG. 18, and the corresponding cut-fin isolation region between the p-type FinFETs may have the same structure as shown in FIG. 17A. In accordance with alternative embodiments, since p-type FinFETs use holes as dominate carriers, the p-type FinFETs may not suffer from the leakage problems caused by the accumulated charges as aforementioned. Accordingly, on the same die and on the same semiconductor substrate 20, the cut-fin isolation region for isolating the source/drain regions of p-type FinFETs may have the structure shown in FIG. 19. The respective cut-fin isolation region 76 also cuts the fins, while the STI regions 22 exposed during the removal of the gate stacks are not etched. Accordingly, STI region 22" remains between two extending portions of the corresponding isolation region 76. The formation of isolation region 76 is similar to what are discussed referring to FIGS. 11A, 11B, and 11C through FIGS. 17A, 17B, and 17C, except after the steps shown in FIGS. 12A, 12B, and 12C, protruding fins 24', semiconductor strips 24, and the underlying bulk portions of substrate 20 are etched to form recesses, while STI region 22" is not etched.

In accordance with some embodiments, isolation regions 66 are formed before the formation of isolation regions 76. In accordance with other embodiments of the present disclosure, isolation regions 66 are formed after the formation of isolation regions 76. The processes are similar to what are shown in FIGS. 9, 10, 11A through 11C, 12A through 12C, 13A through 13C, 14A through 14C, 15A through 15C, 16A through 16C, 17A through 17C, and 18, except that in FIGS. 9 and 10, isolation regions 66 have not been formed yet. Instead, isolation regions 66 are formed after the step shown in FIG. 18.

The embodiments of the present disclosure have some advantageous features. By removing the STI regions that are exposed during the formation of cut-fin isolation regions, the leakage currents caused by the STI regions, especially the leakage currents caused by the defect-prone dielectric liners in the STI regions, is eliminated.

In accordance with some embodiments of the present disclosure, a method includes forming a first semiconductor fin and a second semiconductor fin parallel to each other and protruding higher than top surfaces of isolation regions, wherein the isolation regions comprises a first portion between the first semiconductor fin and the second semiconductor fin; forming a gate stack crossing over the first semiconductor fin and the second semiconductor fin; etching a first portion of the gate stack to form an opening, wherein the first portion of the isolation regions, the first semiconductor fin, and the second semiconductor fin are exposed to the opening; etching the first semiconductor fin, the second semiconductor fin, and the first portion of the isolation regions to extend the opening into a bulk portion of a semiconductor substrate below the isolation regions; and filling the opening with a dielectric material to form a cut-fin isolation region. In an embodiment, the first portion of the isolation regions is etched-through to reveal the bulk portion of the semiconductor substrate. In an embodiment, when the first portion of the isolation regions is etched, second portions of the isolation regions are etched, and the second portions of the isolation regions are on opposite sides of a combined region comprising both the first semiconductor fin and the second semiconductor fin. In an embodiment, the etching the first semiconductor fin, the second semiconductor fin, and the first portion of the isolation regions comprises performing a first etch step to recess the first portion of the isolation regions; performing a second etch step to etch the first semiconductor fin and the second semiconductor fin; and performing a third etch step to fully remove the first portion of the isolation regions. In an embodiment, in the first etch step, the first semiconductor fin and the second semiconductor fin are substantially un-etched, and in the second etch step, remaining portions of the first portion of the isolation regions is substantially un-etched. In an embodiment, the method further comprises forming a cut-metal isolation region to cut the gate stack into the first portion and a second portion, wherein a sidewall of the cut-metal isolation region is exposed to the opening. In an embodiment, a portion of the cut-fin isolation region in contact with the cut-metal isolation region has a bottom surface higher than a bottom surface of the cut-metal isolation region.

In accordance with some embodiments of the present disclosure, a method includes forming a first semiconductor fin and a second semiconductor fin parallel to each other and protruding higher than top surfaces of isolation regions, wherein the isolation regions extend into a semiconductor substrate, and the isolation regions comprises bottom surfaces; forming a gate stack crossing over the first semiconductor fin and the second semiconductor fin; and replacing a portion of the gate stack with a cut-fin isolation region, wherein the cut-fin isolation region further comprises portions penetrating through the first semiconductor fin and the second semiconductor fin, and the cut-fin isolation region extends lower than bottom surfaces of the isolation regions. In an embodiment, an entire bottom surface of the cut-fin isolation region is lower than the bottom surfaces of the isolation regions. In an embodiment, the forming the cut-fin isolation region comprises etching a portion of the gate stack to form an opening, wherein a portion of the first semiconductor fin, a portion of the second semiconductor fin, and a first portion of the isolation regions are exposed to the opening, and the first portion of the isolation regions is between the first semiconductor fin and the second semiconductor fin; etching the portion of the first semiconductor fin, the portion of the second semiconductor fin and the first portion of the isolation regions to extend the opening into a bulk portion of a semiconductor substrate below the isolation regions; and filling the opening with a dielectric material to form the cut-fin isolation region. In an embodiment, when the first portion of the isolation regions is etched, second portions of the isolation regions are also etched, and the second portions of the isolation regions are on opposite sides of a combined region comprising both the first semiconductor fin and the second semiconductor fin. In an embodiment, the filling the opening with the dielectric material comprises forming a silicon oxide region in contacting the bulk portion of the semiconductor substrate. In an embodiment, the method further includes forming a first cut-metal isolation region and a second cut-metal isolation region, each cutting the gate stack into two portions, wherein a first sidewall and a second sidewall of the cut-fin isolation region are in contact with sidewalls of the first cut-metal isolation region and the second cut-metal isolation region. In an embodiment, the forming the gate stack comprises forming a metal gate stack. In an embodiment, the gate stack is between two gate spacers, and the cut-fin isolation region is formed between the two gate spacers.

In accordance with some embodiments of the present disclosure, a device includes a first semiconductor fin and a second semiconductor fin parallel to each other and protruding higher than top surfaces of isolation regions; a first gate stack and a second gate stack crossing over the first semiconductor fin and the second semiconductor fin; a first cut-metal isolation region and a second cut-metal isolation region parallel to the first semiconductor fin and the second semiconductor fin, wherein the first semiconductor fin and the second semiconductor fin are between the first cut-metal isolation region and the second cut-metal isolation region, and the first cut-metal isolation region and the second cut-metal isolation region both penetrate through the first gate stack and the second gate stack; and a cut-fin isolation region between the first gate stack and the second gate stack, wherein the cut-fin isolation region has a first end contacting the first cut-metal isolation region and a second end contacting the second cut-metal isolation region, and a portion of the isolation regions between the first semiconductor fin and the second semiconductor fin is penetrated-through by the cut-fin isolation region. In an embodiment, an entirety of a bottom surface of the cut-fin isolation region is lower than a bottom surface of the isolation regions. In an embodiment, portions of the cut-fin isolation region in contact with the first semiconductor fin are formed of silicon oxide. In an embodiment, a bottom surface of the cut-fin isolation region comprises a first portion aligned to portions of the first semiconductor fin in a top view of the device; a second portion aligned to additional portions of the second semiconductor fin in the top view of the device; and a third portion connecting the first portion to the second portion of the bottom surface, wherein the third portion is higher than the first portion and the second portion. In an embodiment, the isolation regions comprise a silicon nitride liner; and a silicon oxide region over and contacting a bottom portion of the silicon nitride liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first semiconductor fin and a second semiconductor fin parallel to each other and protruding higher than top surfaces of isolation regions, wherein the isolation regions comprise:
        a first portion between the first semiconductor fin and the second semiconductor fin;
    forming a gate stack crossing over the first semiconductor fin and the second semiconductor fin;
    etching a first portion of the gate stack to form an opening, wherein the first portion of the isolation regions, the first semiconductor fin, and the second semiconductor fin are exposed to the opening;
    etching the first semiconductor fin, the second semiconductor fin, and the first portion of the isolation regions to extend the opening into a bulk portion of a semiconductor substrate below the isolation regions; and
    filling the opening with a dielectric material to form a cut-fin isolation region.

2. The method of claim 1, wherein the first portion of the isolation regions is etched-through to reveal the bulk portion of the semiconductor substrate.

3. The method of claim 1, wherein when the first portion of the isolation regions is etched, second portions of the isolation regions are etched, and the second portions of the isolation regions are on opposite sides of a combined region comprising both the first semiconductor fin and the second semiconductor fin.

4. The method of claim 1, wherein the etching the first semiconductor fin, the second semiconductor fin, and the first portion of the isolation regions comprises:
performing a first etch step to recess the first portion of the isolation regions;
performing a second etch step to etch the first semiconductor fin and the second semiconductor fin; and
performing a third etch step to fully remove the first portion of the isolation regions.

5. The method of claim 4, wherein in the first etch step, the first semiconductor fin and the second semiconductor fin are substantially un-etched, and in the second etch step, remaining portions of the first portion of the isolation regions is substantially un-etched.

6. The method of claim 1 further comprising forming a cut-metal isolation region to cut the gate stack into the first portion and a second portion, wherein a sidewall of the cut-metal isolation region is exposed to the opening.

7. The method of claim 6, wherein a portion of the cut-fin isolation region in contact with the cut-metal isolation region has a bottom surface higher than a bottom surface of the cut-metal isolation region.

8. A method comprising:
forming a first semiconductor fin and a second semiconductor fin parallel to each other and protruding higher than top surfaces of isolation regions, wherein the isolation regions extend into a semiconductor substrate, and the isolation regions comprises bottom surfaces;
forming a gate stack crossing over the first semiconductor fin and the second semiconductor fin;
forming a first cut-metal isolation region cutting the gate stack into two portions; and
replacing a portion of the gate stack with an additional isolation region, wherein the additional isolation region further comprises portions penetrating through the first semiconductor fin and the second semiconductor fin, and the additional isolation region extends lower than bottom surfaces of the isolation regions, wherein a first sidewall of the additional isolation region is in contact with a second sidewall of the first cut-metal isolation region.

9. The method of claim 8, wherein an entire bottom surface of the additional isolation region is lower than the bottom surfaces of the isolation regions.

10. The method of claim 8, wherein the forming the additional isolation region comprises:
etching a portion of the gate stack to form an opening, wherein a portion of the first semiconductor fin, a portion of the second semiconductor fin, and a first portion of the isolation regions are exposed to the opening, and the first portion of the isolation regions is between the first semiconductor fin and the second semiconductor fin;
etching the portion of the first semiconductor fin, the portion of the second semiconductor fin and the first portion of the isolation regions to extend the opening into a bulk portion of the semiconductor substrate below the isolation regions; and
filling the opening with a dielectric material to form the additional isolation region.

11. The method of claim 10, wherein when the first portion of the isolation regions is etched, second portions of the isolation regions are also etched, and the second portions of the isolation regions are on opposite sides of a combined region comprising both the first semiconductor fin and the second semiconductor fin.

12. The method of claim 10, wherein the filling the opening with the dielectric material comprises forming a silicon oxide region in contacting the bulk portion of the semiconductor substrate.

13. The method of claim 8 further comprising:
forming a second cut-metal isolation region cutting the gate stack into addition two portions, wherein a third sidewall of the additional isolation region is in contact with a fourth sidewall of the second cut-metal isolation region, and wherein the first sidewall and the third sidewall are opposing sidewalls of the additional isolation region.

14. The method of claim 13, wherein the first cut-metal isolation region and the second cut-metal isolation region are formed in a first process, and the additional isolation region is formed in a second process, with the first process and the second process being different processes.

15. The method of claim 8, wherein the gate stack is between two gate spacers, and the additional isolation region is formed between the two gate spacers.

16. A method comprising:
forming isolation regions extending into a semiconductor substrate, wherein the isolation regions comprise a first isolation region and a second isolation region, with a portion of the semiconductor substrate being between the first isolation region and the second isolation region;
recessing the isolation regions, wherein the portion of the semiconductor substrate protrudes higher than the first isolation region and the second isolation region to form a semiconductor fin;
forming a gate stack, wherein the gate stack extends over the semiconductor fin, the first isolation region, and the second isolation region;
removing a portion of the gate stack, wherein the portion of the gate stack is directly over the semiconductor fin, the first isolation region, and the second isolation region;
etching the semiconductor fin, the first isolation region, and the second isolation region to expose underlying portions of the semiconductor substrate, and to form a recess extending into the semiconductor substrate; and
filling a dielectric material into the recess.

17. The method of claim 16, wherein the forming the gate stack comprises forming a high-k dielectric layer and a metal gate electrode over the high-k dielectric layer.

18. The method of claim 16, wherein the etching the semiconductor fin, the first isolation region, and the second isolation region is stopped on the semiconductor substrate.

19. The method of claim 16, wherein the etching the semiconductor fin, the first isolation region, and the second isolation region comprises:
a first etching process to recess the first isolation region and the second isolation region;
a second etching process to remove the semiconductor fin, wherein the second etching process is stopped after an additional recess formed by the second etching process extends to a level lower than a bottom surface of the first isolation region; and a third etching process to remove remaining portions of the first isolation region and the second isolation region.

20. The method of claim 19, wherein in the first etching process, the semiconductor fin is un-etched.

* * * * *